(12) United States Patent
Kim

(10) Patent No.: US 11,908,398 B2
(45) Date of Patent: *Feb. 20, 2024

(54) DISPLAY DEVICE

(71) Applicant: SAMSUNG DISPLAY CO., LTD., Yongin-si (KR)

(72) Inventor: Byoung Yong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/644,997

(22) Filed: Dec. 17, 2021

(65) Prior Publication Data

US 2022/0114955 A1     Apr. 14, 2022

Related U.S. Application Data

(63) Continuation of application No. 16/389,884, filed on Apr. 19, 2019, now Pat. No. 11,227,542.

(30) Foreign Application Priority Data

Jul. 4, 2018    (KR) ........................ 10-2018-0077494

(51) Int. Cl.
    *G09G 3/3208*      (2016.01)
    *H01L 51/00*      (2006.01)
    (Continued)

(52) U.S. Cl.
    CPC ....... *G09G 3/3208* (2013.01); *H01L 23/5329* (2013.01); *H01L 27/1218* (2013.01); *H10K 50/84* (2023.02); *H10K 71/621* (2023.02)

(58) Field of Classification Search
None
See application file for complete search history.

(56) References Cited

U.S. PATENT DOCUMENTS

| 7,679,084 | B2 * | 3/2010 | Choo | ................ H01L 27/14692 |
| | | | | 349/149 |
| 9,276,230 | B2 * | 3/2016 | Kim | ..................... H10K 50/805 |

(Continued)

FOREIGN PATENT DOCUMENTS

| JP | 2003-131253 A | 5/2003 |
| JP | 2009-54833 A | 3/2009 |

(Continued)

OTHER PUBLICATIONS

Office action dated Sep. 20, 2022 issued in corresponding Korean Patent Application No. KR 10-2018-0077494, 7pp.

(Continued)

*Primary Examiner* — Patrick N Edouard
*Assistant Examiner* — Peijie Shen
(74) *Attorney, Agent, or Firm* — Lewis Roca Rothgerber Christie LLP

(57) ABSTRACT

A display device includes: a display area; a non-display area around the display area; a substrate; and a first terminal in the non-display area on the substrate, the first terminal including: a plurality of first conductive patterns spaced apart from each other, an insulating layer covering each of the plurality of first conductive patterns, and a second conductive pattern on the insulating layer, covering the plurality of first conductive patterns, and including concave and convex portions on a surface thereof.

12 Claims, 25 Drawing Sheets

(51) Int. Cl.
*H01L 23/532* (2006.01)
*H01L 51/52* (2006.01)
*H01L 27/12* (2006.01)
*H10K 50/84* (2023.01)
*H10K 71/00* (2023.01)

(56) References Cited

U.S. PATENT DOCUMENTS

| | | | |
|---|---|---|---|
| 9,772,523 B2 | 9/2017 | Lim | |
| 10,109,704 B2 | 10/2018 | Shin et al. | |
| 10,381,418 B2 | 8/2019 | Kim et al. | |
| 10,553,664 B2* | 2/2020 | Park | G02F 1/13452 |
| 10,937,838 B2 | 3/2021 | Kim et al. | |
| 2002/0121666 A1 | 9/2002 | Choo et al. | |
| 2003/0164919 A1 | 9/2003 | Oh et al. | |
| 2007/0076393 A1 | 4/2007 | Jeong et al. | |
| 2011/0050551 A1* | 3/2011 | Ota | G09G 3/3648 345/87 |
| 2012/0138935 A1 | 6/2012 | Park et al. | |
| 2012/0139000 A1 | 6/2012 | Lee et al. | |
| 2015/0108452 A1* | 4/2015 | Park | H10K 59/131 257/40 |
| 2015/0287365 A1* | 10/2015 | Song | G09G 3/20 345/82 |
| 2016/0062520 A1* | 3/2016 | Choi | H10K 59/123 345/174 |
| 2017/0222207 A1 | 8/2017 | Pezdek et al. | |
| 2017/0243933 A1 | 8/2017 | Kuriyagawa et al. | |
| 2017/0250199 A1 | 8/2017 | Odaka | |
| 2017/0288007 A1* | 10/2017 | Shin | H10K 71/00 |
| 2017/0317299 A1 | 11/2017 | Choi et al. | |
| 2017/0358642 A1* | 12/2017 | Jo | H10K 59/131 |
| 2018/0019220 A1* | 1/2018 | Ryu | H01L 24/13 |
| 2018/0061855 A1* | 3/2018 | Min | H01L 27/124 |
| 2018/0061895 A1* | 3/2018 | Kim | H10K 50/13 |
| 2018/0062102 A1 | 3/2018 | Kim | |
| 2018/0090555 A1* | 3/2018 | Lhee | G09G 3/3233 |
| 2018/0166526 A1* | 6/2018 | Kim | H10K 59/1213 |
| 2018/0174952 A1* | 6/2018 | Kim | H01L 23/49811 |
| 2019/0164955 A1* | 5/2019 | Andou | H01L 27/0296 |
| 2019/0165297 A1* | 5/2019 | Lee | G09G 3/3225 |
| 2019/0326384 A1* | 10/2019 | Zhou | H10K 59/17 |
| 2019/0348487 A1* | 11/2019 | Kim | H10K 50/805 |

FOREIGN PATENT DOCUMENTS

| | | |
|---|---|---|
| JP | 2010-191134 A | 9/2010 |
| JP | 2017-151371 A | 8/2017 |
| JP | 2017-152178 A | 8/2017 |
| KR | 10-2010-0073924 A | 7/2010 |
| KR | 10-2016-0124981 A | 10/2016 |
| KR | 10-1744784 B1 | 6/2017 |
| KR | 10-2017-0114029 A | 10/2017 |
| KR | 10-2017-0121674 A | 11/2017 |
| KR | 10-2018-0000046 | 1/2018 |
| KR | 10-2018-0025382 A | 3/2018 |
| TW | 201248740 A1 | 12/2012 |

OTHER PUBLICATIONS

Examination Report for corresponding IN Application No. 201914026652, dated Nov. 1, 2022, 6pp.

EPO Extended Search Report dated Nov. 21, 2019, for corresponding European Patent Application No. 19184158.4 (9 pages).

Office action issued in corresponding TW 108123614, dated Mar. 6, 2023, 18pp.

* cited by examiner

DISPLAY DEVICE

CROSS-REFERENCE TO RELATED APPLICATION

This application is a continuation of U.S. patent application Ser. No. 16/389,884, filed Apr. 19, 2019, which claims priority to and the benefit of Korean Patent Application No. 10-2018-0077494 filed on Jul. 4, 2018, in the Korean Intellectual Property Office, the entire contents of which are incorporated herein by reference.

BACKGROUND

1. Field

Embodiments of the present disclosure relate to a display device.

2. Description of the Related Art

A display device is a device for visually displaying data (e.g., images). Such a display device includes a substrate partitioned into a display area and a non-display area. In the display area, a plurality of pixels are arranged on the substrate, and in the non-display area, a plurality of pads and the like are arranged on the substrate. A flexible film (COF film) equipped with a driving circuit or the like is attached to the plurality of pads to transmit driving signals to the pixels.

The flexible film includes a plurality of leads coupled with the plurality of pads, and the respective leads may be bonded to the pads, which are separated from each other. The bonding may be performed by an ultrasonic bonding process. When each of the leads of the flexible film is coupled to (e.g., connected to) the pad by the ultrasonic bonding, stress is applied to the interface of the pads. In this case, if sufficient or suitable stress is not generated between the lead and the pad, contacting each other, defective bonding may occur.

SUMMARY

Aspects of embodiments of the present disclosure provide a display device capable of increasing the bonding reliability of pads.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of embodiments of the present disclosure given herein below.

According to an aspect of an embodiment of the present disclosure, there is provided a display device including: a display area; a non-display area around the display area; a substrate; and a first terminal disposed in the non-display area on the substrate, wherein the first terminal includes: a plurality of first conductive patterns spaced apart from each other, an insulating layer covering each of the plurality of first conductive patterns, and a second conductive pattern disposed on the insulating layer, covering the plurality of first conductive patterns, and including concave and convex portions on a surface thereof.

In an exemplary embodiment, the convex portion of the surface of the second conductive pattern may overlap each of the first conductive patterns, and the concave portion of the surface of the second conductive pattern overlaps an area where each of the first conductive patterns is not disposed.

In an exemplary embodiment, the surface of the insulating layer may conformally reflect a step due to the plurality of first conductive patterns, and the concave and convex portions of the surface of the second conductive pattern are conformally reflected by the surface of the insulating layer.

In an exemplary embodiment, the insulating layer may include an inorganic insulating material.

In an exemplary embodiment, the plurality of first conductive patterns and the second conductive pattern may include different materials from each other (e.g., the plurality of first conductive patterns may include a material that is different from that of the second conductive pattern).

In an exemplary embodiment, the plurality of first conductive patterns may include molybdenum (Mo), and the second conductive pattern may include aluminum (Al).

In an exemplary embodiment, the insulating layer may include concave and convex portions on a surface thereof, a width of the convex portion of the second conductive pattern is greater than a width of the convex portion of the insulating layer corresponding thereto in a thickness direction, and a width of the convex portion of the insulating layer is greater than a width of the first conductive pattern corresponding thereto in the thickness direction.

In an exemplary embodiment, a width of the concave portion of the second conductive pattern may be smaller than a width of the concave portion of the insulating layer corresponding thereto in the thickness direction, and a width of the concave portion of the insulating layer is smaller than a width of a non-layout space of the first conductive pattern corresponding thereto in the thickness direction.

In an exemplary embodiment, the insulating layer includes at least one contact hole, and each of the first conductive patterns may be electrically coupled to (e.g., electrically connected to) the second conductive pattern through the contact hole.

In an exemplary embodiment, the display device may further comprise a second insulating layer and a plurality of third conductive patterns sequentially disposed between the plurality of first conductive patterns and the insulating layer, wherein the plurality of third conductive patterns overlap the plurality of first conductive patterns in a thickness direction.

In an exemplary embodiment, the insulating layer may include an inorganic insulating material, each of the plurality of first conductive patterns and the plurality of third conductive patterns includes molybdenum (Mo), and the second conductive pattern includes aluminum (Al).

In an exemplary embodiment, the second conductive pattern may extend in a first direction, each of the plurality of first conductive patterns extends in a second direction perpendicular (e.g., substantially perpendicular) to the first direction, and the plurality of first conductive patterns are arranged in the first direction.

In an exemplary embodiment, the second conductive pattern may extend in a first direction, and the plurality of first conductive patterns have an island shape and are arranged along the first direction and a second direction perpendicular (e.g., substantially perpendicular) to the first direction.

In an exemplary embodiment, the second conductive pattern may extend in a first direction, each of the plurality of first conductive patterns extends in a zigzag shape along a second direction perpendicular (e.g., substantially perpendicular) to the first direction, and the plurality of first conductive patterns are arranged along the first direction.

In an exemplary embodiment, the second conductive pattern may extend in a first direction, each of the plurality of first conductive patterns extends in a zigzag shape along the first direction, and the plurality of first conductive patterns are arranged along a second direction perpendicular (e.g., substantially perpendicular) to the first direction.

In an exemplary embodiment, the second conductive pattern may be integrally formed, and extends outward from both ends of the plurality of first conductive patterns to completely cover the plurality of first conductive patterns.

In an exemplary embodiment, the display device may further comprise a first film attached onto the substrate in the non-display area, wherein the first film includes a second terminal ultrasonically bonded to the first terminal.

In an exemplary embodiment, the display device may further comprise a circuit substrate attached to the first film, wherein the first film further includes a third terminal spaced from the second terminal, and the circuit substrate includes a fourth terminal ultrasonically bonded to the second terminal.

According to an aspect of an embodiment of the present disclosure, there is provided a display device, a display device includes a display area including a thin film transistor and a non-display area disposed around the display area and including a pad area, comprising: a substrate; a first conductive layer on the substrate; a first insulating layer on the first conductive layer; and a second conductive layer on the first insulating layer, wherein the first conductive layer includes a plurality of first pad conductive patterns disposed in the pad area, the second conductive layer includes a second pad conductive pattern disposed in the pad area, and the second pad conductive pattern covers the plurality of first pad conductive patterns and includes concave and convex portions on a surface thereof.

In an exemplary embodiment, the second conductive layer may further include a source/drain electrode of the thin film transistor of the display area.

In an exemplary embodiment, the first conductive layer may further include a gate electrode of the thin film transistor of the display area.

In an exemplary embodiment, the display area may further include a capacitor, and the first conductive layer includes a first electrode of the capacitor of the display area.

In an exemplary embodiment, the convex portion of the surface of the second pad conductive pattern may overlap each of the first pad conductive patterns, and the concave portion of the surface of the second pad conductive pattern overlaps an area where each of the first pad conductive patterns is not disposed.

In an exemplary embodiment, the surface of the insulating layer may conformally reflect a step due to the plurality of first pad conductive patterns, and the concave and convex portions of the surface of the second pad conductive pattern are conformally reflected by the surface of the insulating layer.

In an exemplary embodiment, the insulating layer may include an inorganic insulating layer.

In an exemplary embodiment, the plurality of first pad conductive patterns and the second pad conductive pattern may include different materials from each other.

In an exemplary embodiment, the plurality of first pad conductive patterns may include molybdenum (Mo), and the second pad conductive pattern includes aluminum (Al).

In an exemplary embodiment, the insulating layer may include concave and convex portions on a surface thereof, a width of the convex portion of the second pad conductive pattern is greater than a width of the convex portion of the insulating layer corresponding thereto in a thickness direction, and a width of the convex portion of the insulating layer is greater than a width of each of the first pad conductive patterns corresponding thereto in the thickness direction.

In an exemplary embodiment, a width of the concave portion of the second pad conductive pattern may be smaller than a width of the concave portion of the insulating layer corresponding thereto in the thickness direction, and a width of the concave portion of the insulating layer is smaller than a width of a non-layout space of each of the first pad conductive patterns corresponding thereto in the thickness direction.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

Figure 1:
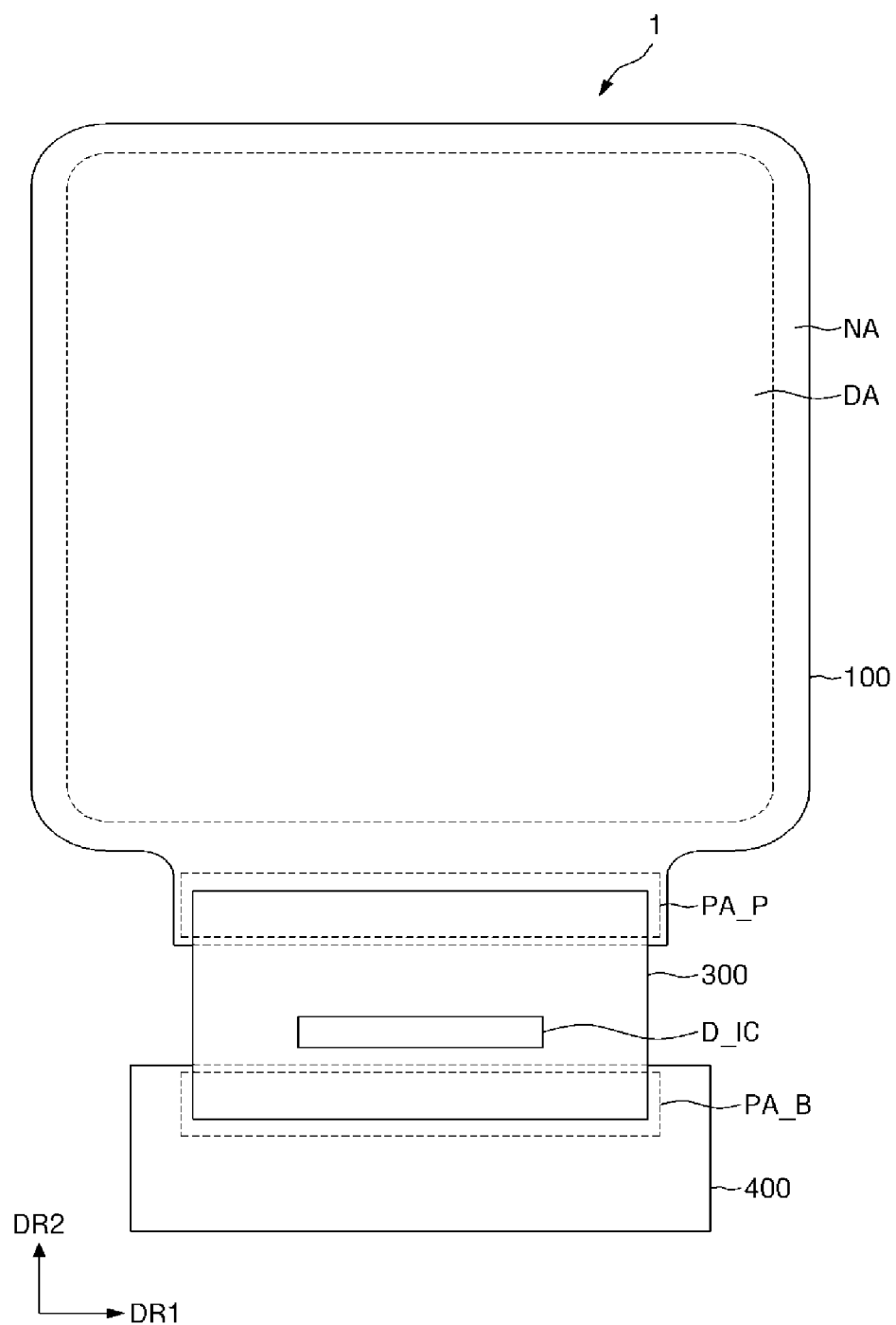
FIG. 1 is a plan view of a display device according to an embodiment.

The features of the subject matter of the present disclosure, and methods for achieving those features, will be apparent by referring to the embodiments to be described in more detail herein with reference to the accompanying drawings. However, the present disclosure is not limited to the embodiments disclosed hereinafter, but can be implemented in diverse forms. The matters defined in the description, such as the detailed construction and elements, are details provided to assist those of ordinary skill in the art in a comprehensive understanding of the subject matter of the present disclosure, and the present disclosure is only defined by the scope of the appended claims, and equivalents thereof.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

Throughout the present disclosure, the same reference numerals are used for the same or similar parts.

Hereinafter, embodiments of the present disclosure will be described with reference to the attached drawings.

Figure 2:
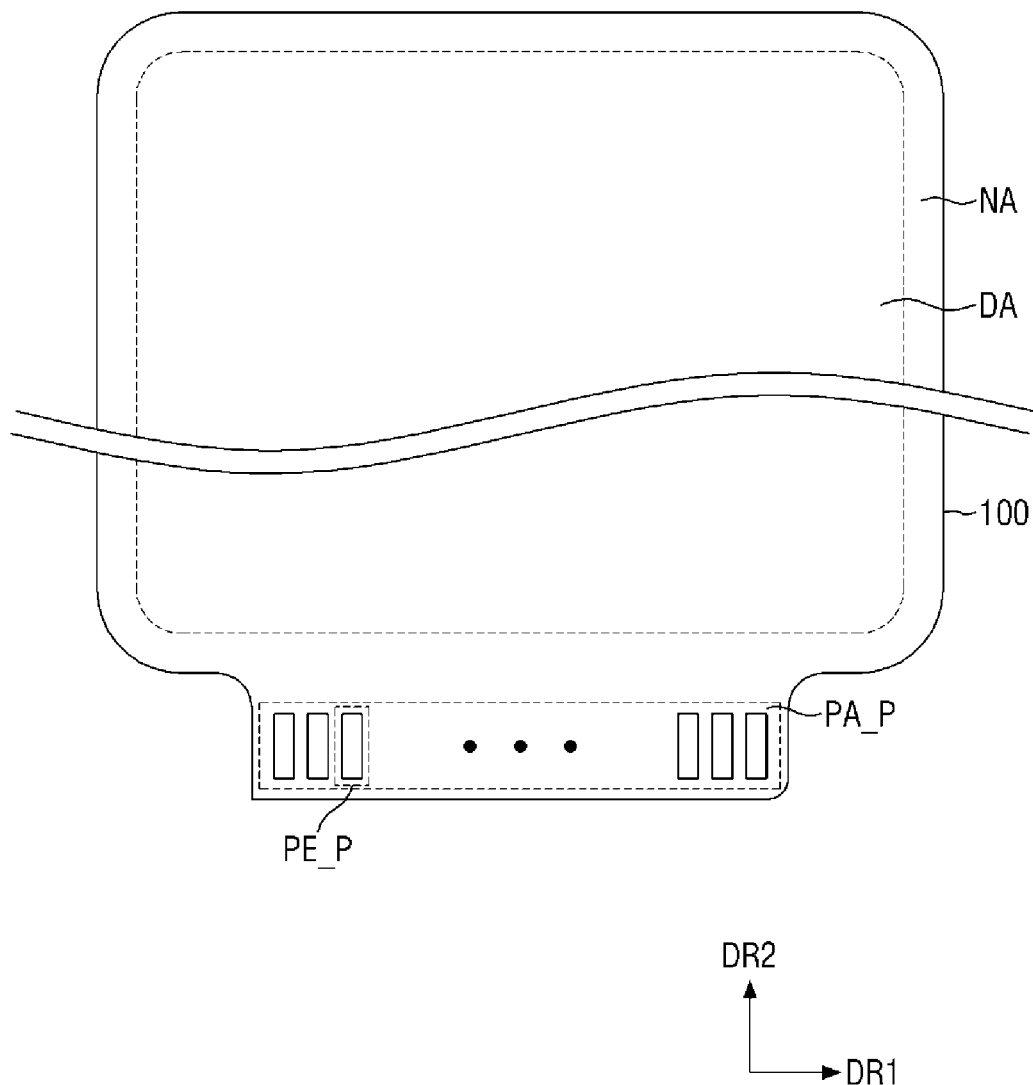
FIG. 2 is an enlarged plan view of the display panel of FIG. 1.

FIG. 1 is a plan view of a display device according to an embodiment, and FIG. 2 is an enlarged plan view of the display panel of FIG. 1.

A display device 1, which is a device for displaying a moving image or a still image, may be used as a display screen for various suitable products such as televisions, notebook computers, monitors, billboards, and internet of things, as well as portable electronic appliances such as mobile phones, smart phones, tablet personal computers (PCs), smart watches, watch phones, mobile communication terminals, electronic notebooks, electronic books, portable multimedia players (PMPs), navigators, and ultra mobile PCs.

Referring to FIGS. 1-2, the display device 1 includes a display area DA for displaying an image and a non-display area NA disposed around the display area DA. The display area DA may have a rectangular shape having vertical corners or a rectangular shape having rounded corners in a plan view. The planar shape of the display area DA is not limited to a rectangle, and the display area DA may have a circular shape, an elliptical shape, or various other suitable shapes.

The non-display area NA is disposed around the display area DA. The non-display area NA may be disposed adjacent to both short sides of the display area DA. Moreover, the non-display area NA may be disposed adjacent to both long sides as well as both short sides of the display area DA, and may surround all sides of the display area DA. For example, the non-display area NA may constitute a frame of the display area DA.

The display device 1 may include a display panel 100 for displaying an image.

For example, as the display panel 100, an organic light emitting display panel may be applied. In the following embodiments, there is exemplified a case where an organic light emitting display panel is applied as a display panel, but the present disclosure is not limited, and other types (or kinds) of display panels such as a liquid crystal display panel, a quantum nano emitting display panel, a micro-LED, a field emission display panel, and an electrophoretic display panel may be applied as the display panel.

The display panel 100 includes a plurality of pixels. The plurality of pixels may be arranged in the display area DA. The display panel 100 may include a panel pad area PA_P disposed in the non-display area NA. The panel pad area PA_P is located at one side of the display area DA in the non-display area NA. For example, as shown in FIG. 1, the panel pad area PA_P may be disposed adjacent to the lower side DR2 of the display area DA. The width of the non-display area NA (lower side of the display area in the drawing) in the second direction DR2 where the panel pad area PA_P is located may be greater than the width of the other non-display area NA (upper side, left side, or right side of the display area in the drawing) in the first direction DR1 and/or the second direction DR2 where the panel pad area PA_P is not located.

As shown in FIG. 2, a plurality of panel pad terminals PE_P may be arranged in the panel pad area PA_P. The plurality of panel pad terminals PE_P may be arranged in a row in one direction. For example, the plurality of panel pad terminals PE_P may be arranged in the first direction DR1. Although it is shown in the drawings that the panel pad area PA_P includes one row of the plurality of panel pad terminals PE_P, the present disclosure is not limited thereto, and the panel pad area PA_P may include two or more rows spaced apart from each other in the second direction DR2. Each of the panel pad terminal PE_P may be coupled to (e.g., connected to) a wiring extending from the display area DA. Further, each of the panel pad terminals PE_P may be electrically coupled to (e.g., electrically connected to) a data driving integrated circuit to be described later. Each of the panel pad terminals PE_P may have a surface concave-convex shape. Since the panel pad terminal PE_P has a surface concave-convex shape, bonding reliability between the panel pad terminal PE_P and the COF film 300 may be increased. Additional details thereof will be further described herein below.

In an embodiment, the data driving integrated circuit may be formed in the form of a data driving chip D_IC. The data driving chip D_IC may be attached to a plastic substrate or a glass substrate by a chip on plastic (COP) method or a chip on glass (COG) method. Hereinafter, a case where a chip on film (COF) method, in which the data driving chip D_IC is attached to a display panel through a flexible film, is applied will be mainly described.

When the chip on film (COF) method is applied, as shown in FIG. 1, the COF film 300 including the data driving chip D_IC may be attached to the panel pad area PA_P of the display panel 100. In an embodiment, one end of the COF film 300 in the second direction DR2 may be attached to the panel pad area PA_P of the display panel 100. Meanwhile, the PCB substrate 400 may be attached to the other end of the COF film 300 in the second direction DR2. Additional details of the COF film 300 and the PCB substrate 400 will be further described herein below.

Figure 3:
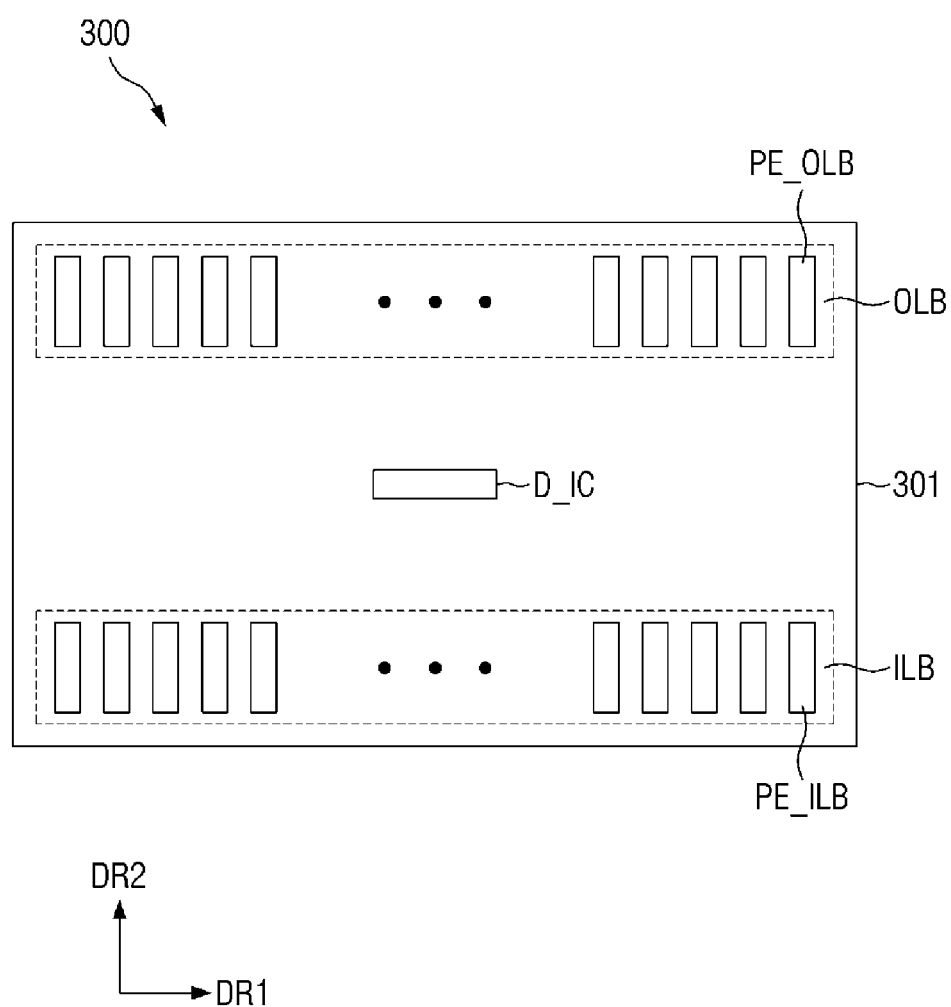
FIG. 3 is a plan view of the COF film of FIG. 1.

FIG. 3 is a plan view of the COF film of FIG. 1.

As shown in FIG. 3, the COF film 300 may include a base film 301, and a data driving chip D_IC1, a plurality of input lead terminals PE_ILB, and a plurality of output lead terminals PE_OLB, which are disposed on the base film 301.

The base film 301 may serve to support the elements disposed on the base film 301, and may include a soft material. For example, the base film 301 may include polyethylene terephthalate (PET), polyimide (PI), polycarbonate (PC), polyethylene (PE), polypropylene (PP), polysulfone (PSF), polymethylmethacrylate (PMMA), triacetylcellulose (TAC), or cycloolefin polymer (COP).

The data driving chip D_IC may be disposed on one region of the base film 301, for example, the center of the base film 301. The data driving chip D_IC may function to receive a video signal applied from the PCB substrate 400, convert the video signal into a data signal in the form of an analog voltage, and transmit the data signal to a pixel.

The plurality of output lead terminals PE_OLB may be arranged on one end of the base film 301 in the second direction DR2. The output lead terminals PE_OLB may be arranged in a row in one direction. For example, the output lead terminals PE_OLB may be arranged in parallel (e.g., substantially in parallel) to each other in the first direction DR1. Although it is shown in the drawings that the input lead terminals PE_ILB are arranged in a single row, the present disclosure is not limited thereto, and the input lead terminals PE_ILB may be arranged in a plurality of rows spaced apart in the second direction DR2. The input lead terminal PE_ILB may be attached to the PCB pad area PA_B of the PCB substrate 400 by, for example, ultrasonic bonding.

Figure 4:
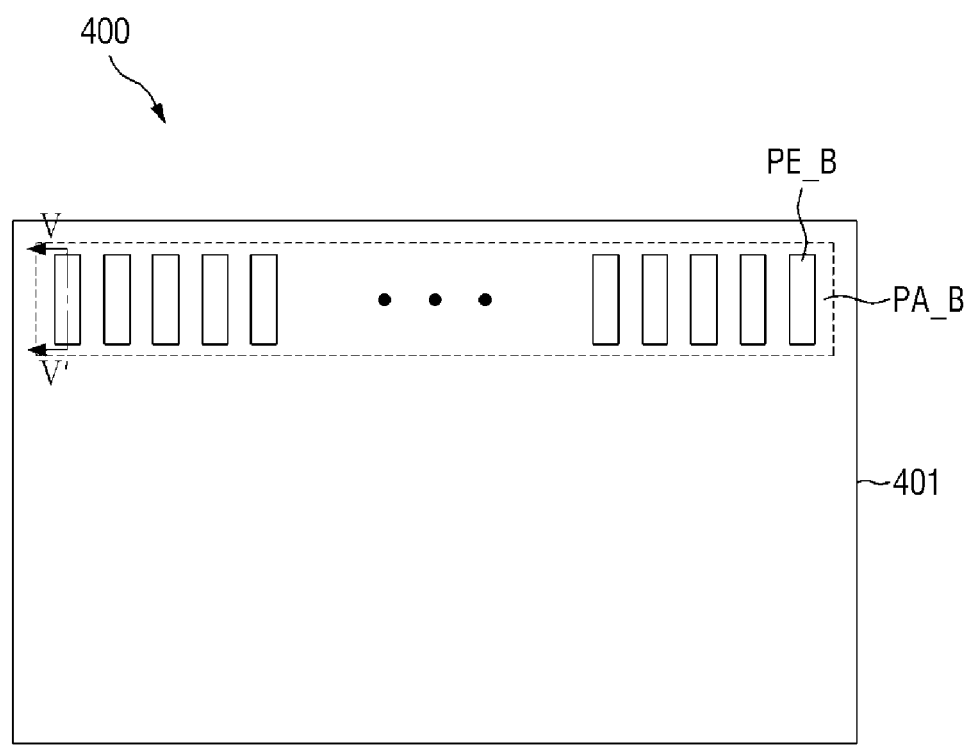
FIGS. 4-5 are a plan view and a cross-sectional view, respectively, of the PCB substrate of FIG. 1.
Figure 4:
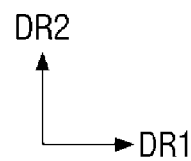

The size of each of the output lead terminals PE_OLB and the input lead terminals PE_ILB may be smaller than that of the panel pad terminal PE_P or the PCB pad terminal (refer to FIG. 4 'PE_B'). However, the present disclosure is not limited thereto, and the size of each of the output lead terminals PE_OLB and the input lead terminals PE_ILB may be equal to or larger than that of the panel pad terminal PE_P or the PCB pad terminal.

The materials of the plurality of output lead terminals PE_OLB and the input lead terminals PE_ILB are not particularly limited as long as they are materials capable of easily bonding with the panel pad terminals PE_P and the PCB pad terminals (refer to FIG. 4 'PE_B'). For example, the output lead terminals PE_OLB and the input lead terminals PE_ILB may be formed of at least one of gold (Au), nickel (Ni), and tin (Sn). The plurality of output lead terminals PE_OLB and the input lead terminals PE_ILB may have a single film structure or laminate film structure formed of the above material.

Each of the output lead terminals PE_OLB of the COF film 300 may be directly bonded and coupled to (e.g., connected to) each of the panel pad terminals PE_P of the display panel 100. Further, each of the input lead terminals PE_ILB may be directly bonded and coupled to (e.g., connected to) each of the PCB pad terminals PE_B of the PCB substrate 400. In an embodiment, the output lead terminal PE_OLB and the input lead terminal PE_ILB of the COF film 300 may be electrically coupled to (e.g., electrically connected to) the panel pad terminals PE_P and the PCB pad terminals (refer to 'PE_B' in FIG. 4) of the PCB substrate 400 without interposing another layer or configuration. This direct coupling (e.g., direct connecting) may be accomplished through ultrasonic bonding. Ultrasonic bonding will be described in more detail with reference to FIGS. 9-10 after describing the structure of the PCB substrate 400 and the structure of the panel pad terminal PE_P.

Figure 5:
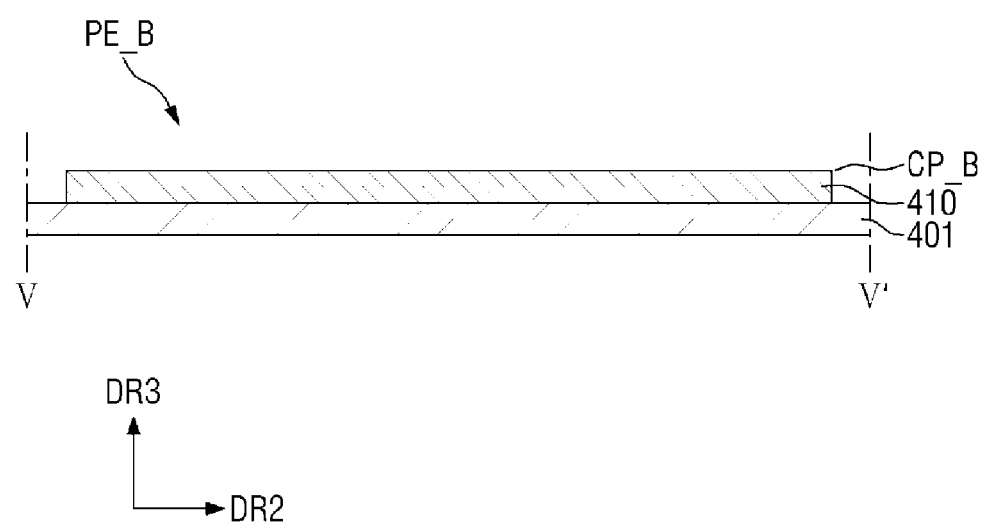

FIG. 4 is a plan view of the PCB substrate of FIG. 1, and FIG. 5 is a cross-sectional view taken along line V-V' of FIG. 4.

As shown in FIGS. 4-5, the PCB substrate 400 may include a base substrate 401 and a plurality of PCB pad terminals PE_B disposed on the base substrate 401.

The base substrate 401 may serve to support the elements disposed on the base substrate 401. The base substrate 401 may be a rigid substrate including a material such as glass or quartz, but the present disclosure is not limited thereto. The base substrate 401 may be a flexible substrate including a soft material. When the base substrate 401 is a flexible substrate, the base substrate 401 may include polyethylene terephthalate (PET), polyimide (PI), polycarbonate (PC), polyethylene (PE), polypropylene (PP), polysulfone (PSF), polymethylmethacrylate (PMMA), triacetylcellulose (TAC), or cycloolefin polymer (COP).

A PCB pad area PA_B may be disposed in one region on the base substrate 401. A plurality of PCB pad terminals PE_B may be arranged in the PCB pad area PA_B. The plurality of PCB pad terminals PE_B may be arranged in a row in one direction. The PCB pad terminals PE_B may constitute a plurality of rows, and may also constitute a single row.

The PCB pad terminal PE_B may include a PCB conductive pattern CP_B disposed on the base substrate 401, as shown in FIG. 5. The PCB conductive pattern CP_B may include an integrally formed PCB conductive electrode 410. The PCB conductive electrode 410 may be made of one of copper (Cu), tin (Sn), gold (Au), and nickel (Ni), and may be formed of a single film or a multilayer film.

Each of the PCB pad terminals PE_B of the PCB substrate 400 may be electrically coupled to (e.g., electrically connected to) each of the input lead terminals PE_ILB of the above-described COF film 300. Each of the PCB pad terminals PE_B and each of the input lead terminals PE_ILB may be ultrasonically bonded. In some embodiments, the PCB pad terminal PE_B, similarly to the panel pad terminal PE_P, may have a surface concave-convex shape. When the PCB pad terminal PE_B has a surface concave-convex shape, the bonding reliability of the PCB substrate 400 and the COF film 300 may be increased. Contents related to this will be described later with reference to FIGS. 18A-18C and 19A-19C.

Hereinafter, the cross-sectional structures of the pixel and pad area of the display panel 100 will be described in more detail.

Figure 6:
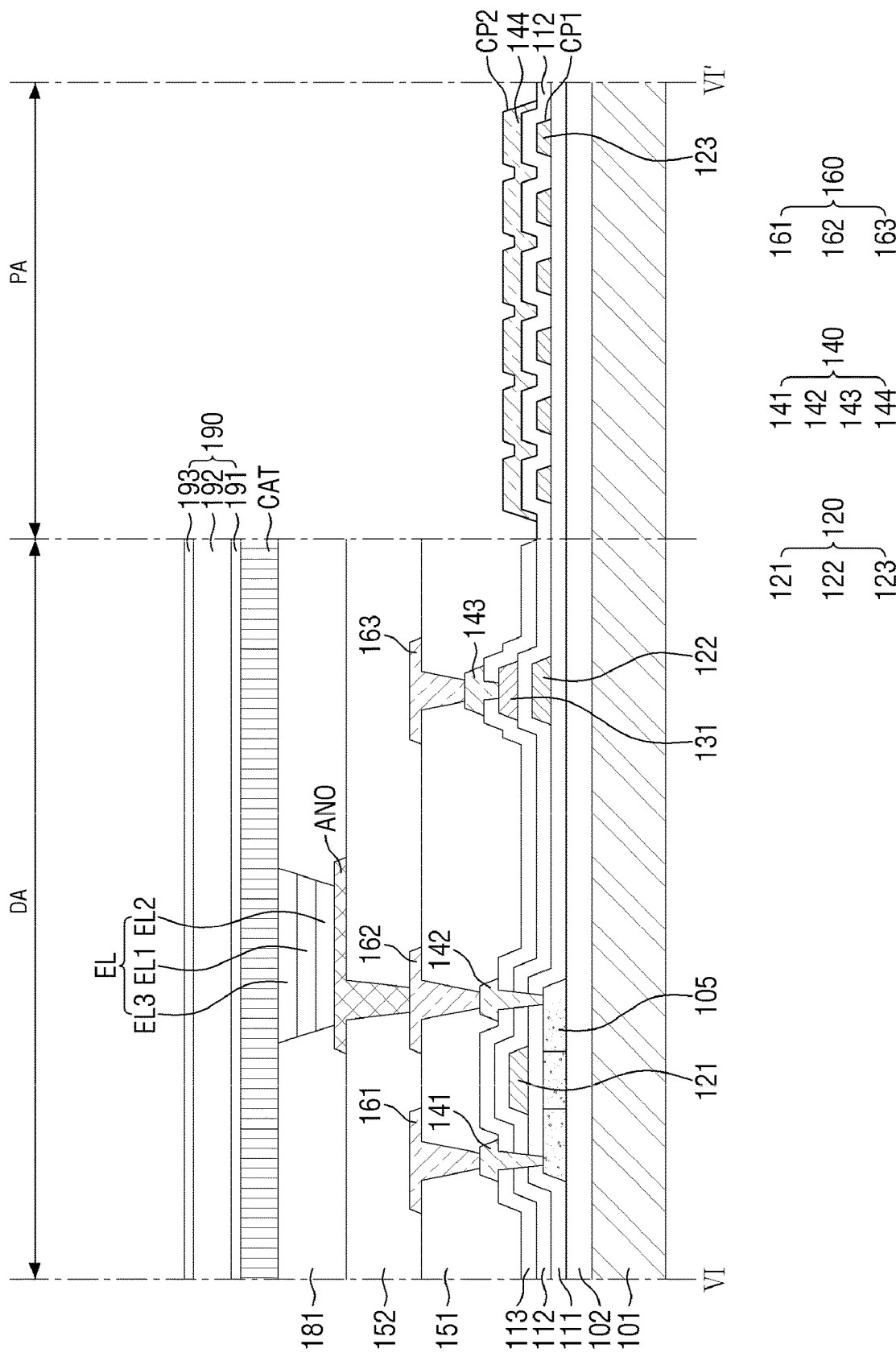
FIG. 6 is a cross-sectional view of the display panel.

FIG. 6 is a cross-sectional view of a display panel according to an embodiment. FIG. 6 shows a cross-sectional shape of a pixel and a pad region taken along the second direction of FIG. 2.

Referring to FIG. 6, the display panel 100 includes a base substrate 101, and a plurality of conductive layers, a plurality of insulating layers, and an organic light emitting layer, which are disposed on the base substrate 101.

For example, the base substrate 101 may serve the respective layers disposed thereon. The base substrate 101 may be disposed over the display area DA and the non-display area NA. The base substrate 101 may include a polymer material having an insulating function. Examples of the polymer material may include polyethersulphone (PES), polyacrylate (PA), polyarylate (PAR), polyetherimide (PEI), polyethylene naphthalate (PEN), polyethylene terephtalate (PET), polyphenylene sulfide (PPS), polyallylate, polyimide (PI), polycarbonate (PC), cellulose triacetate (CAT), cellulose acetate propionate (CAP), and combinations thereof. The base substrate 101 may be a flexible substrate capable of bending, folding, rolling, or the like. An example of the material constituting the flexible substrate is polyimide (PI), but is not limited thereto. The base substrate 101 may be a rigid substrate made of glass, quartz or the like.

A buffer layer 102 may be disposed on the base substrate 101. The buffer layer 102 may be disposed over the entire display area DA and non-display area NA. The buffer layer 102 may prevent or reduce the diffusion of impurity ions, may prevent or reduce the penetration of moisture or external air, and may perform a surface planarization function. The buffer layer 102 may cover most of the display area DA and the non-display area NA of the base substrate 101. The buffer layer 102 may include silicon nitride, silicon oxide, or silicon oxynitride.

A semiconductor layer 105 may be disposed on the buffer layer 102. The semiconductor layer 105 constitutes a channel of a thin film transistor. The semiconductor layer 105 is disposed in each pixel of the display area DA, and may be disposed in the non-display area NA in some cases.

The semiconductor layer 105 may include a source/drain region and an active region. The semiconductor layer 105 may include polycrystalline silicon. The polycrystalline silicon may be formed by crystallizing amorphous silicon. Examples of the crystallization method may include, but are not limited to, rapid thermal annealing (RTA), solid phase crystallization (SPC), excimer laser annealing (ELA), metal induced crystallization (MIC), metal induced lateral crystallization (MILC), and sequential lateral solidification (SLS). Impurity ions (p-type impurity ions in the case of a PMOS transistor) may be doped in a region (source/drain region) coupled to (e.g., connected to) the source/drain electrodes 141 and 142 of a thin film transistor TFT in the semiconductor layer 105. Trivalent dopants such as boron (B) may be used as p-type impurity (ions). In another embodiment, the semiconductor layer 105 may include monocrystalline silicon, low-temperature polycrystalline silicon, amorphous silicon, or an oxide semiconductor. Examples of the oxide semiconductor may include two-component compounds (ABx), three-component compounds (ABxCy), and four-component compounds (ABxCyDz), each containing at least one of zinc (Zn), gallium (Ga), tin (Sn), titanium (Ti), aluminum (Al), hafnium (Hf), zirconium (Zr), and magnesium (Mg). In an embodiment, the semiconductor layer 105 may include ITZO (an oxide including indium, tin, and titanium) or IGZO (an oxide including indium, gallium, and tin).

A first insulating layer 111 may be disposed on the semiconductor layer 105. The first insulating layer 111 may be disposed over the entire surface of the base substrate 101 including the display area DA and the non-display area NA.

The first insulating layer 111 may be a gate insulating film having a gate insulating function.

The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, or titanium oxide. They may be used alone or in combination with two or more.

A first gate conductive layer 120 may be disposed on the first insulating layer 111. In an embodiment, the first gate conductive layer 120 may include a gate electrode 121 of a thin film transistor TFT, a first electrode 122 of a storage capacitor Cst, and a first pad conductive pattern CP1. In addition, the first gate conductive layer 120 may further include a scanning signal line for transmitting a scanning signal to the gate electrode 121.

The first pad conductive pattern CP1 may include a plurality of conductive electrodes 123. The conductive electrodes 123 may be disposed to be spaced apart from each other in the second direction. The buffer layer 102 may be exposed through an area where the first pad conductive pattern CP1 is not disposed. In an embodiment, the shape of the panel pad terminal PE_P may be changed depending on whether or not the first pad conductive pattern CP1 is disposed. Contents related to this will be described in more detail with reference to FIGS. 7-8.

The gate electrode 121 of the thin film transistor TFT, the first electrode 122 of the storage capacitor Cst, and the first pad conductive pattern CP1 may be formed of the same (e.g., substantially the same) material under the same (e.g., substantially the same) process. For example, the first gate conductive layer 123 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Although it is shown in the drawings that the first gate conductive layer 120 is a single-layer film, in some cases, the first gate conductive layer 120 may be a multi-layer film. In this case, the multi-layer film of the first gate conductive layer 120 may be formed of a laminate film of different metals among the above-described metals.

A second insulating layer 112 may be disposed on the first gate conductive layer 120. The second insulating layer 112 may be disposed over the entire surface of the base substrate 101 including the display area DA and the non-display area NA. The second insulating layer 112 may isolate the first gate conductive layer 120 from the second gate conductive layer 130. The second insulating layer 112 may be an interlayer insulating film.

The second insulating layer 112 may include an inorganic insulating material such as silicon oxide, silicon nitride, silicon oxynitride, hafnium oxide, aluminum oxide, titanium oxide, tantalum oxide, or zinc oxide. The second insulating layer 112 made of an inorganic insulating material may conformally reflect a lower step.

A second gate conductive layer 130 may be disposed on the second insulating layer 112. The second gate conductive layer 130 may include a second electrode 131 of the storage capacitor Cst. The second electrode 131 of the storage capacitor Cst may overlap the first electrode 122 with the second insulating layer 112 interposed therebetween. For example, the first electrode 122 and the second electrode 131 may constitute the storage capacitor Cst having the second insulating layer 112 as a dielectric film.

The second gate conductive layer 130 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the second gate conductive layer 130 may be made of the same (e.g., substantially the same) material as the above-described first gate conductive layer 120. Although it is shown in the drawings that the second gate conductive layer 130 is a single-layer film, in some cases, the second gate conductive layer 130 may be a multi-layer film.

A third insulating layer 113 is disposed on the second gate conductive layer 130. The third insulating layer 113 may isolate the second gate conductive layer 130 from a first source/drain conductive layer 140.

Meanwhile, although it is exemplified in the present embodiment that the second insulating layer 112 is disposed on the first pad conductive pattern CP1 in the panel pad area PA_P and the third insulating layer 113 is not disposed in the panel pad area PA_P, the present disclosure is not limited thereto. For example, the third insulating layer 113 is disposed over the entire surface of the display area DA and the non-display area NA including the panel pad area PA_P, and may be disposed on the second insulating layer 112 and the first pad conductive pattern CP1. In this case, the second insulating layer 112 may be omitted, and the third insulating layer 113 may be disposed directly on the first pad conductive pattern CP1.

The third insulating layer 113 may include an inorganic insulating material such as silicon oxide, silicon nitride, silicon oxynitride, hafnium oxide, aluminum oxide, titanium oxide, tantalum oxide, or zinc oxide.

A first source/drain conductive layer 140 may be disposed on the third insulating layer 113. In an embodiment, the first source/drain conductive layer 140 may include a source electrode 141, a drain electrode 142 and a power supply voltage electrode 143 of a thin film transistor (TFT), and a second pad conductive pattern CP2. The source electrode 141 and drain electrode 142 of the thin film transistor (TFT)

may be electrically coupled to (e.g., electrically connected to) the source region and drain region of the semiconductor layer 105 through a contact hole penetrating the third insulating layer 113, second insulating layer 112, and the first insulating layer 111, respectively.

The second pad conductive pattern CP2 may be disposed on the second insulating layer 112 of the panel pad area PA_P. The second pad conductive pattern CP2 may conformally reflect a lower step. For example, the second pad conductive pattern CP2 may include an area overlapping the first pad conductive pattern CP1 having a step to include surface unevenness, and an area not overlapping this first pad conductive pattern CP1, and in this case, the second pad conductive pattern CP2 may conformally reflect the step of the first pad conductive pattern CP1, and thus, the area overlapping the first pad conductive pattern CP1 may protrude in a thickness direction by the thickness of the first pad conductive pattern CP1 as compared with the area where first pad conductive pattern CP1 is not disposed. Accordingly, the upper surface of the second pad conductive pattern CP2 in the panel pad terminal PE_P may include a concave portion and a convex portion.

A first via layer 151 and the like are laminated on the first source/drain conductive layer 140. In an embodiment, the layers on the first source/drain conductive layer 140 are not disposed in the panel pad area PA_P of the non-display area DA and thus, may expose the second pad conductive pattern CP2. Each of the output lead terminals PE_OLB of the COF film 300 may be coupled to (e.g., connected to) the upper surface of the exposed first pad conductive pattern CP1.

The first source/drain conductive layer 140 may include at least one selected from molybdenum (Mo), aluminum (Al), platinum (Pt), palladium (Pd), silver (Ag), gold (Au), nickel (Ni), neodymium (Nd), iridium (Ir), chromium (Cr), calcium (Ca), titanium (Ti), tantalum (Ta), tungsten (W), and copper (Cu). The first source/drain conductive layer 140 may be a single film as shown in the drawing. However, the present disclosure is not limited thereto, and the first source/drain conductive layer 140 may be a multi-layer film. For example, the first source/drain conductive layer 140 may have a laminate structure of Ti/Al/Ti, Mo/Al/Mo, Mo/AlGe/Mo, or Ti/Cu.

The first via layer 151 may be disposed on the first source/drain conductive layer 140. The first via layer 151 may include an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB).

A second source/drain conductive layer 160 may be disposed on the first via layer 151. The second source/drain conductive layer 160 may include a data signal line 161, a connection electrode 162, and a power supply voltage line 163. The data signal line 161 may be electrically coupled to (e.g., electrically connected to) the source electrode 141 of the thin film transistor TFT through a contact hole penetrating the first via layer 151. The connection electrode 162 may be electrically coupled to (e.g., electrically connected to) the drain electrode 142 of the thin film transistor TFT through the contact hole penetrating the first via layer 151. The power supply voltage line 163 may be electrically coupled to (e.g., electrically connected to) the power supply voltage electrode 143 through the contact hole penetrating the first via hole 151.

In an embodiment, it is exemplified that the second source/drain conductive layer 160 is not disposed in the panel pad area PA_P of the non-display area NA. However, in some embodiments, the second source/drain conductive layer 160 may be disposed in the panel pad area PA_P of the non-display area NA. Contents related to this will be described later.

The second source/drain conductive layer 160 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second source/drain conductive layer 160 may be a single film. However, the present disclosure is not limited thereto, and the second source/drain conductive layer 160 may be a multi-layer film. For example, the second source/drain conductive layer 160 may have a laminate structure of Ti/Al/Ti, Mo/Al/Mo, Mo/AlGe/Mo, or Ti/Cu.

A second via layer 152 may be disposed on the second source/drain conductive layer 160. The second via layer 152 may include an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB).

An anode electrode ANO is disposed on the second via layer 152. The anode electrode ANO may be coupled to (e.g., connected to) the connection electrode 162 through a contact hole penetrating the second via layer 152, and may be electrically coupled to (e.g., electrically connected to) the drain electrode 142 of the thin film transistor (TFT) through the contact hole.

A pixel defining layer 181 may be disposed on the anode electrode ANO. The pixel defining layer 181 may include an opening exposing the anode electrode ANO. The pixel defining layer 181 may be made of an organic insulating material or an inorganic insulating material. In an embodiment, the pixel defining layer 181 may include a material such as a photoresist, a polyimide resin, an acrylic resin, a silicon compound, or a polyacrylic resin.

An organic layer EL may be disposed on the upper surface of the anode electrode ANO and in the opening of the pixel defining layer 181. Although it is shown in the drawing that the organic layer EL is disposed only in the opening of the pixel defining layer 181, the present disclosure is not limited thereto, and the organic layer EL may be disposed to extend from the opening of the pixel defining layer 181 to the upper surface of the pixel defining layer 181.

The organic layer EL may include an organic light emitting layer EL1, a hole injection/transporting layer EL2, and an electron injection/transporting layer EL3. Although it is illustrated in the drawing that each of the hole injection/transporting layer EL2 and the electron injection/transporting layer EL3 is a single layer, each of the hole injection/transporting layer EL2 and the electron injection/transporting layer EL3 may be a laminate of a plurality of layers. Further, at least one of the hole injection/transporting layer EL2 and the electron injection/transporting layer EL3 may be a common layer disposed over a plurality of pixels.

A cathode electrode CAT is disposed on the organic EL layer and the pixel defining layer 181. The cathode electrode CAT may be a common electrode disposed over a plurality of pixels.

A thin film encapsulating layer 190 is disposed on the organic layer EL. The thin film encapsulating layer 190 may cover an organic light emitting element OLED. The thin film encapsulating layer 190 may be a laminate film where inorganic films and organic films are alternately laminated. For example, the thin film encapsulating layer 190 may include a first inorganic film 191, an organic film 192, and a second inorganic film 193, which are sequentially laminated.

Hereinafter, a structure of one panel pad terminal PE_P of the panel pad area PA_P according to an embodiment will be described in more detail.

Figure 7:
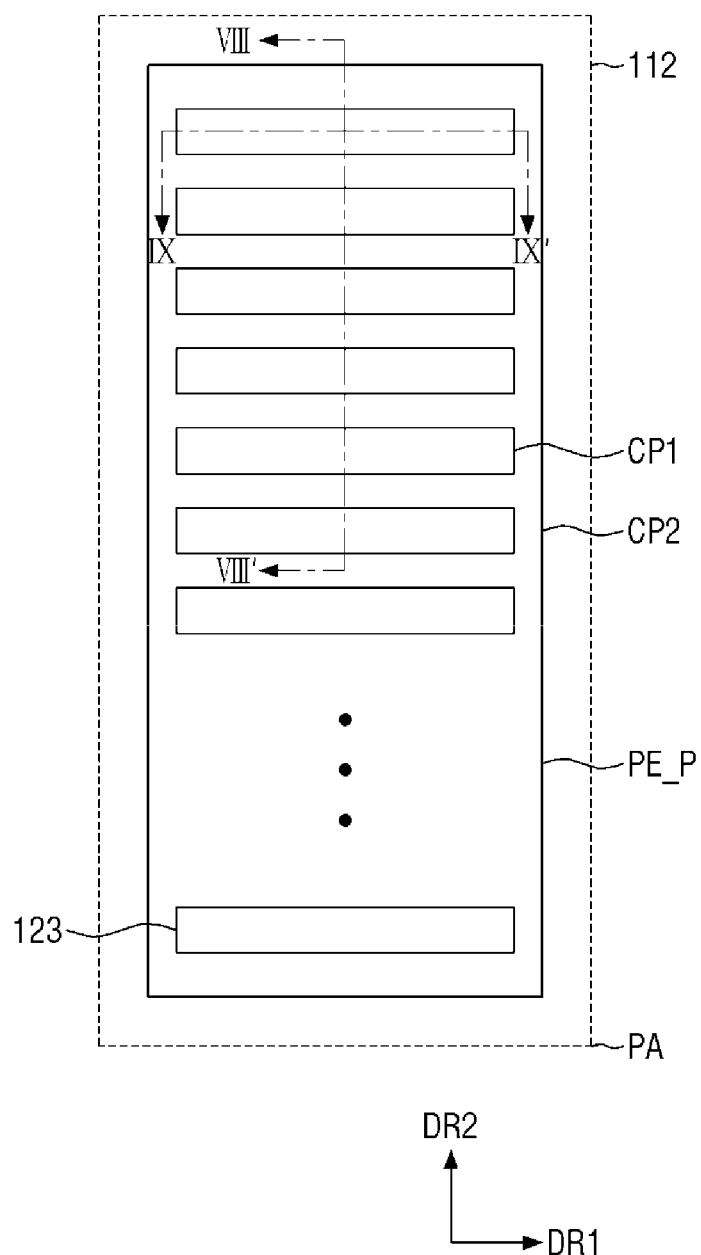
FIG. 7 is an enlarged plan view of one panel pad terminal of FIG. 2.
Figure 8:
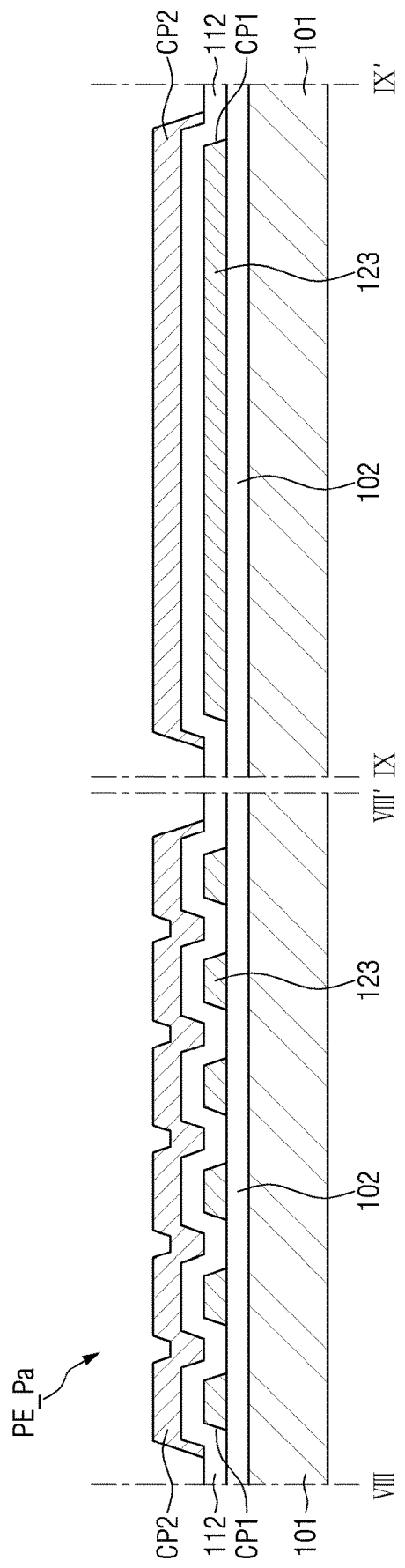
FIG. 8 is a cross-sectional view taken along lines VIII-VIII' and IX-IX' of FIG. 7.

FIG. 7 is an enlarged plan view of one panel pad terminal of FIG. 2, and FIG. 8 is a cross-sectional view taken along lines VIII-VIII' and IX-IX' of FIG. 7.

As described above, the first pad conductive pattern CP1 may be disposed on the buffer layer 102. The first pad conductive pattern CP1 may include a plurality of conductive electrodes 123 disposed to be spaced apart from each other in the second direction DR2. The plurality of conductive electrodes 123 disposed to be spaced apart from each other in the second direction DR2 may be formed by floating on the buffer layer 102 without being coupled to (e.g., connected to) the display area DA of the display panel 100 through wirings.

The buffer layer 102 may be exposed through an area where the first pad conductive pattern CP1 is not disposed. One panel pad terminal PE_P may include an area where the first pad conductive pattern CP1 is disposed and an area where the first pad conductive pattern CP1 is not disposed. The area where the first pad conductive pattern CP1 is disposed may protrude by the thickness of the first pad conductive pattern CP1 as compared with the area where first pad conductive pattern CP1 is not disposed, so as to form a convex portion. Conversely, the area where the first pad conductive pattern CP1 is not disposed may recessed by the thickness of the first pad conductive pattern CP1 as compared with the convex portion, so as to form a concave portion. For example, the first pad conductive pattern CP1 may have a surface concave-convex shape in which steps are repeatedly arranged.

The second insulating layer 112 may be integrally formed and disposed on the first pad conductive pattern CP1 and/or the exposed upper surface of the first pad conductive pattern CP1. The second insulating layer 112 may cover the first pad conductive pattern CP1. The second insulating layer 112 may have a uniform (e.g., substantially uniform) thickness over the first pad conductive pattern CP1 and/or over the exposed upper surface of the first pad conductive pattern CP1. However, the present disclosure is not limited thereto, and the thickness of the second insulating layer 112 disposed in the area where the first pad conductive pattern CP1 is not disposed may be greater than the thickness of the second insulating layer 112 disposed in the area where the first pad conductive pattern CP1 is disposed. The second insulating layer 112 may be larger in size than the first pad conductive pattern CP1 and the second pad conductive pattern CP2. For example, the second insulating layer 112 may extend outward from the first pad conductive pattern CP1 and the second pad conductive pattern CP2.

As described above, since the second insulating layer 112 is formed of an inorganic insulating material and conformally reflects a lower step, the surface of the second insulating layer 112 may have a concavo-convex shape by reflecting a surface step according to the presence or absence of the first pad conductive pattern CP1.

The second pad conductive pattern CP2 may be disposed on the second insulating layer 112. The second pad conductive pattern CP2 may include a region bonded to each of the output lead terminals PE_OLB of the above-described COF film 300. The second pad conductive pattern CP2, unlike the first pad conductive pattern CP1, may be brought into electrical contact with the display area DA of the display panel 100.

The second pad conductive pattern CP2 may be integrally formed. The second pad conductive pattern CP2 may cover an area where the first pad conductive pattern CP1 is disposed. For example, the second pad conductive pattern CP2 may cover all fragments of first pad conductive patterns CP1 on the first pad conductive pattern CP1.

The second pad conductive pattern CP2 may have a set (e.g., predetermined) concavo-convex shape. As described above, since the second pad conductive pattern CP2 is formed of a conductive material and conformally reflects a lower step, the surface of the second pad conductive pattern CP2 may have various suitable concavo-convex shapes by reflecting a surface step according to the presence or absence of the first pad conductive pattern CP1.

In some embodiments, the upper surface of the second pad conductive pattern CP2 in the area where the first pad conductive pattern CP1 is disposed has a step corresponding to the thickness of the first pad conductive electrode 123 as compared with the area where the first pad conductive pattern CP1 is not disposed. For example, the area where the first pad conductive pattern CP1 is disposed in the second pad conductive pattern CP2 protrudes by the thickness of the first pad conductive pattern CP1 as compared with the area where the first pad conductive pattern CP1 is not disposed, so as to form a convex portion. Further, the area where the first pad conductive pattern CP1 is not disposed is recessed by the thickness of the first pad conductive pattern CP1 as compared with the convex portion, so as to form a concave portion.

However, due to the structure where the first pad conductive pattern CP1, the second insulating layer 112, and the second pad conductive pattern CP2 are sequentially laminated, the difference in thickness between the convex portion and the concave portion of the second pad conductive pattern CP2 may be smaller than the difference in thickness between the convex portion and the concave portion of the second insulating layer 112 and the difference in thickness between the convex portion and the concave portion of the first pad conductive pattern CP1. Moreover, the difference in thickness between the convex portion and the concave portion of the second insulating layer 112 may be smaller than the difference in thickness between the convex portion and the concave portion of the first pad conductive pattern CP1.

Further, in the structure where the first pad conductive pattern CP1, the second insulating layer 112, and the second pad conductive pattern CP2 are sequentially laminated, the width of the surface concave-convex portion of the second pad conductive pattern CP2 may be greater than the width of the surface concave-convex portion of the first pad conductive pattern CP1 and the width of the surface concave-convex portion of the second insulating layer 112. Moreover, the width of the surface concave-convex portion of the second insulating layer 112 may be greater than the width of the surface concave-convex portion of the first pad conductive pattern CP1.

Unlike this, the width of the concave portion of the second conductive pattern CP2 may be smaller than the width of the concave portion of the second insulating layer 112 in the thickness direction, and the width of the concave portion of the second insulating layer 112 may be smaller than the width of the non-layout space of the first conductive pattern CP1 in the thickness direction.

Hereinafter, an ultrasonic bonding process of the panel pad terminal PE_P1 and the lead terminal of the COF film 300 and an effect due to the concave-convex structure of the panel pad terminal PE_P1 according to an embodiment will be described.

Figure 9:
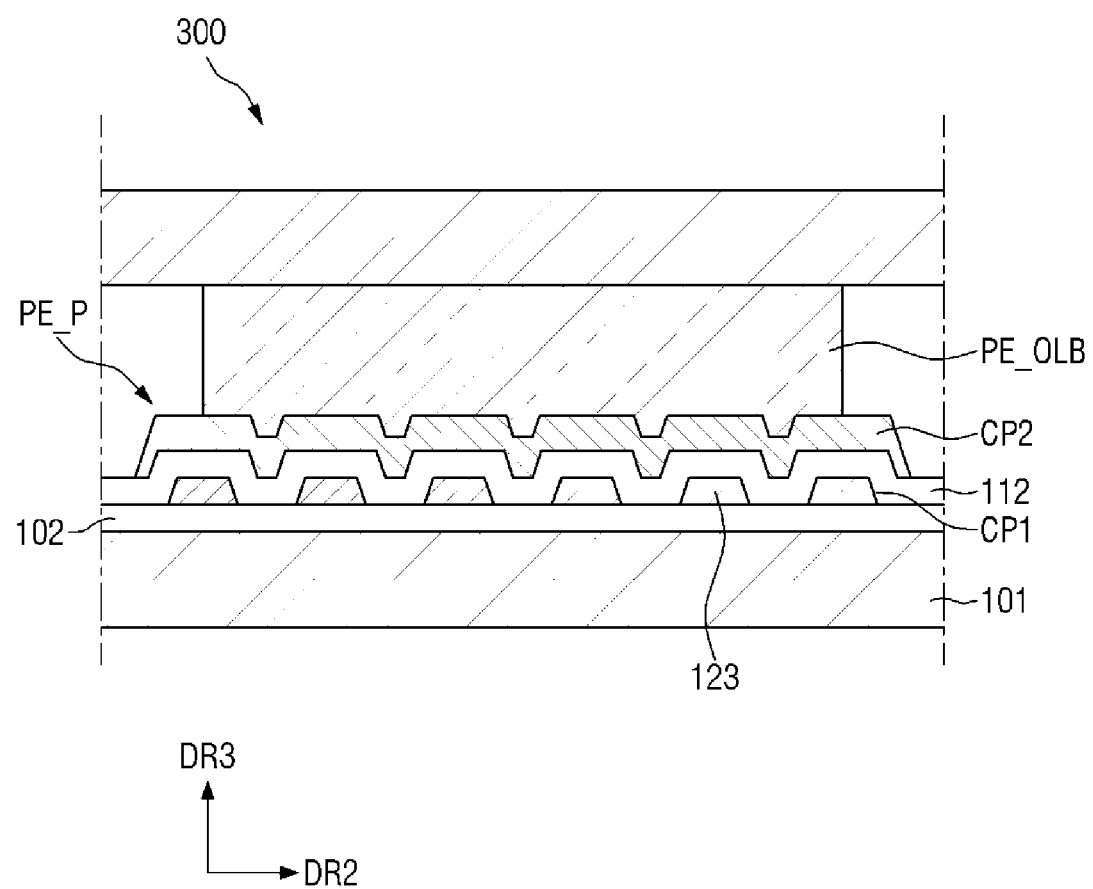
FIGS. 9-10 are cross-sectional views illustrating the bonding steps of the panel pad terminal and the output lead terminal of FIG. 1.
Figure 10:
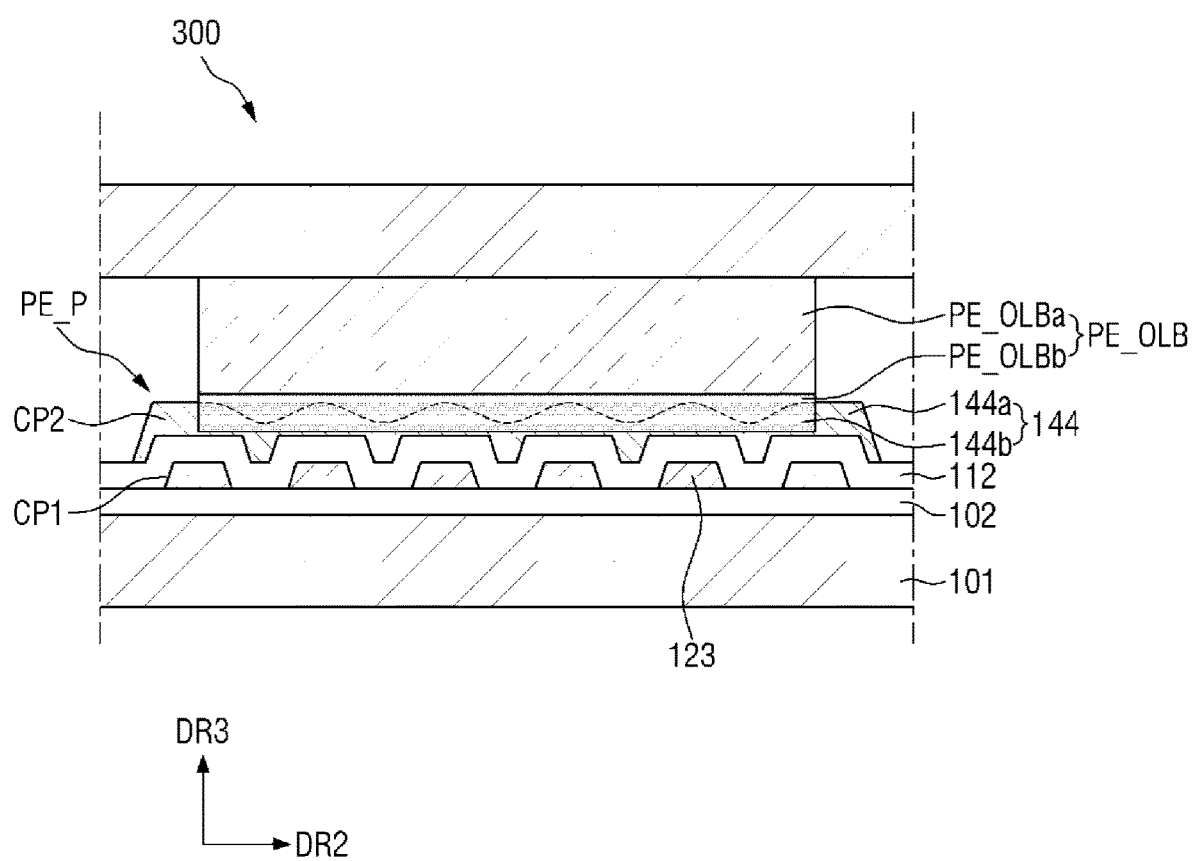

FIGS. 9-10 are cross-sectional views illustrating the bonding steps of the panel pad terminal and the output lead terminal of FIG. 1.

Referring to FIGS. 9-10, when the output lead terminal PE_OLB of the COF film 300 is placed on the panel pad terminal PE_P of the display panel 100 and ultrasonic processing is performed under a constant (e.g., substantially constant) pressure, a frictional force is generated at the interface to cause partial melting, and concurrently (e.g., simultaneously), the respective components may be diffused toward each other. For example, the components included in the output lead terminal PE_OLB of the COF film 300 may be partially diffused into the panel pad terminal PE_P, and the components included in the panel pad terminal PE_P may be partially diffused into the output lead terminal PE_OLB of the COF film 300. As a result, the panel pad terminal PE_P may have an area where the components included in the output lead terminal PE_OLB of the COF film 300 are diffused, and the output lead terminal PE_OLB of the COF film 300 may have an area where the components included in the panel pad terminal PE_P are diffused.

As shown in FIG. 10, in the area 144b where the components of the output lead terminal PE_OLB of the panel pad terminal PE_P are diffused and the area 144a of the components of the panel pad terminal PE_P of the output lead terminal PE_OLB are diffused, the output lead terminal PE_OLB and the panel pad terminal PE_P may be directly coupled to (e.g., directly connected to) each other while being in contact with each other. The interface between the directly coupled (e.g., directly connected) output lead terminal PE_OLB and panel pad terminal PE_P may have a non-flat shape through melting and solidification. Further, with the mutual diffusion of the components, alloys of different materials from each other may be formed at the interface.

However, when the output lead terminal PE_OLB of the COF film 300 is placed on the panel pad terminal PE_P of the display panel 100 and ultrasonic processing is performed under a constant (e.g., substantially constant) pressure, if sufficient or suitable frictional force is not generated between the panel pad terminal PE_P and the output lead terminal PE_OLB, the bonding reliability between the display panel 100 and the COF film 300 may be deteriorated.

However, according to the present embodiment, the bonding reliability between the display panel 100 and the COF film 300 may be improved. For example, as described in the present embodiment, when the surface of the panel pad terminal PE_P includes concave and convex portions, stress applied to the interface between the panel pad terminal PE_P and the output lead terminal PE_OLB, for example, stress applied to the convex portion of the panel pad terminal PE_P, increases, and thus, the panel pad terminal PE_P and the output lead terminal PE_OLB are well melted to easily perform the connection therebetween. Therefore, the bonding reliability of the COF film 300 may be improved.

Meanwhile, in the above embodiment, although it is exemplified that the panel pad terminal PE_P includes a first pad conductive pattern CP1 made of a first gate conductive layer 120 and a second pad conductive pattern CP2 made of a first source/drain conductive layer 140, the present disclosure is not limited thereto.

For example, the first pad conductive pattern CP1 may be formed of the first gate conductive layer 120, the second pad conductive pattern CP2 may be formed of the second gate conductive layer 130, and the second insulating layer 112 may be disposed between the first pad conductive pattern CP1 and the second pad conductive pattern CP2.

As another example, the first pad conductive pattern CP1 may be formed of the first gate conductive layer 120, the second pad conductive pattern CP2 may be formed of a second source/drain conductive layer 160, and the second insulating layer 112 and/or the third insulating layer 113 may be disposed between the first pad conductive pattern CP1 and the second pad conductive pattern CP2.

As another example, the first pad conductive pattern CP1 may be formed of the first gate conductive layer 120, the second pad conductive pattern CP2 may be formed of a laminate structure of the second gate conductive layer 130 and the first source/drain electrode layer 140, and the second insulating layer 112 may be disposed therebetween. In this case, the third insulating layer 113 may be further disposed between the second gate conductive layer 130 and the first source/drain electrode layer 140, but the present disclosure is not limited thereto.

As another example, the first pad conductive pattern CP1 may be formed of the first gate conductive layer 120, the second pad conductive pattern CP2 may be formed of a laminate structure of the second gate conductive layer 130 and the second source/drain electrode layer 160, and the second insulating layer 112 may be disposed therebetween. In this case, the third insulating layer 113 may be further disposed between the second gate conductive layer 130 and the first source/drain electrode layer 140, but the present disclosure is not limited thereto.

As another example, the first pad conductive pattern CP1 may be formed of the first gate conductive layer 120, the second pad conductive pattern CP2 may be formed of a laminate structure of the first source/drain electrode layer 140 and the second source/drain electrode layer 160, and the second insulating layer 112 and/or the third insulating layer 113 may be disposed between the first pad conductive pattern CP1 and the second pad conductive pattern CP2. In this case, the second pad conductive pattern CP2 may further include the second gate conductive layer 120 between the first source/drain electrode layers 140, but the present disclosure is not limited thereto.

As another example, the first pad conductive pattern CP1 may be formed of the second gate conductive layer 130, and the above-described various suitable modifications of the second pad conductive pattern CP2 may be applied.

The panel pad terminal PE_P may be formed of a combination of various other suitable conductive layers.

Hereinafter, other embodiments will be described. In the following embodiments, the same features as those in the previously described embodiments are referred to with the same reference numerals, and a redundant description thereof will not be repeated here or will be simplified.

Figure 11:
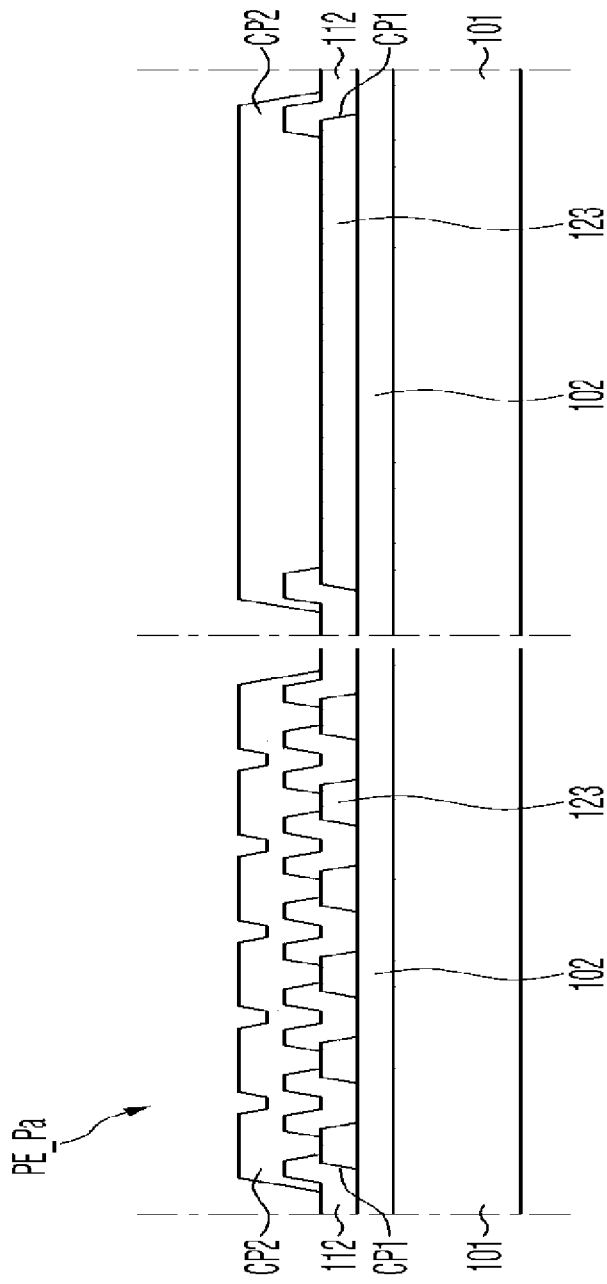
FIG. 11 is a cross-sectional view of a panel pad terminal according to another embodiment.

FIG. 11 is a cross-sectional view of a panel pad terminal according to another embodiment.

Referring to FIG. 11, a panel pad terminal PE_Pa according to another embodiment is different from the embodiment of FIGS. 1-10 in that the panel pad terminal PE_Pa further includes a contact hole CNT through which a second insulating layer 112a electrically couples (e.g., electrically connects) the first pad conductive pattern CP1 and the second pad conductive pattern CP2.

In some embodiments, a second insulating layer 112_1 may include an area exposed on the first pad conductive pattern CP1. The exposed area may be a contact hole CNT through which the first pad conductive pattern CP1 and the second pad conductive pattern CP2 are electrically coupled to (e.g., electrically connected to) each other. Although the contact hole CNT may be smaller than the width of the upper surface of the first pad conductive pattern CP1, the present disclosure is not limited thereto, and the contact hole CNT may be equal to or larger than the width of the upper surface of the first pad conductive pattern CP1.

Even in the present embodiment, when the output lead terminal PE_OLB of the COF film 300 is placed on a panel pad terminal PE_P_1 and ultrasonic processing is performed under a constant (e.g., substantially constant) pressure, if sufficient or suitable frictional force is not generated between the panel pad terminal PE_P_1 and the output lead terminal PE_OLB, the bonding reliability between a display panel 100_1 and the COF film 300 may be deteriorated.

However, according to the present embodiment, the bonding reliability between the panel pad terminal PE_P_1 and the output lead terminal PE_OLB may be improved. For example, as described in the present embodiment, when the surface of the panel pad terminal PE_P_1 includes concave and convex portion, stress applied to the interface between the panel pad terminal PE_P_1 and the output lead terminal PE_OLB, for example, stress applied to the convex portion of the panel pad terminal PE_P_1, increases to increase a frictional force at the convex portion, and thus, the panel pad terminal PE_P_1 and the output lead terminal PE_OLB are well melted to easily perform the connection therebetween. Therefore, the bonding reliability of the COF film 300 may be improved.

Figure 12:
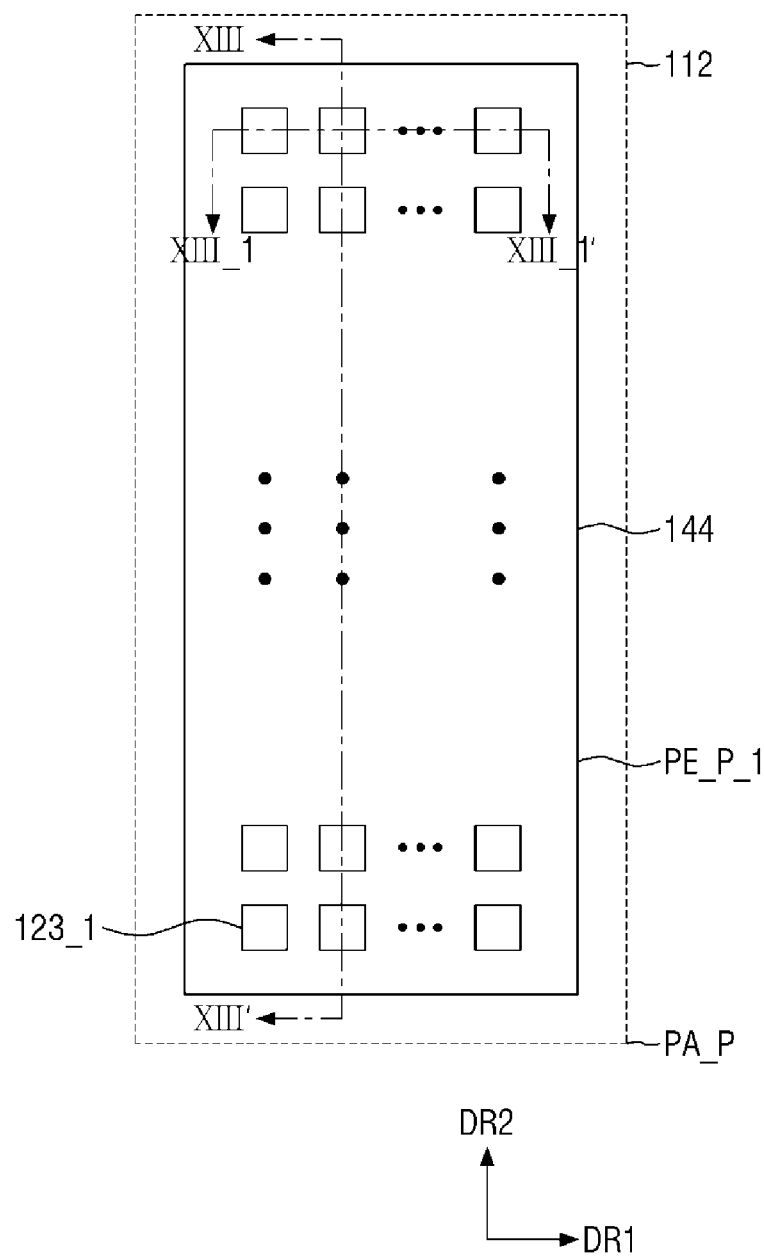
FIGS. 12-13 are a plan view and a cross-sectional view, respectively, of a panel pad terminal according to another embodiment.
Figure 13:
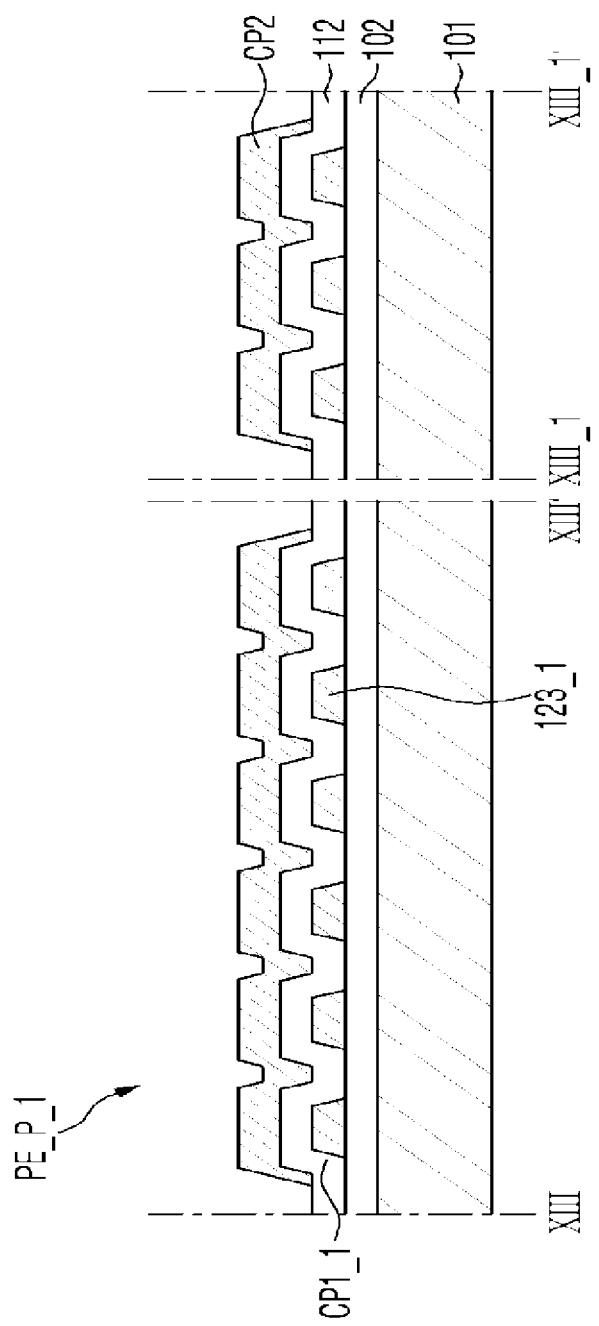

FIGS. 12-13 are a plan view and a cross-sectional view, respectively, of a panel pad terminal according to another embodiment.

Referring to FIGS. 12-13, the panel pad terminal PE_P_1 according to the present embodiment is different from the embodiment of FIGS. 1-10 in that a first pad conductive pattern CP1_1 includes conductive electrodes 123_1 separated from each other in the first direction DR1 and the second direction DR2, respectively.

In some embodiments, in the panel pad terminal PE_P_1 according to the present embodiment, the first pad conductive pattern CP1_1 includes conductive electrodes 123_1 separated from each other in the first direction DR1 and the second direction DR2, respectively.

Even in the present embodiment, when the output lead terminal PE_OLB of the COF film 300 is placed on the panel pad terminal PE_P_1 and ultrasonic processing is performed under a constant (e.g., substantially constant) pressure, if sufficient or suitable frictional force is not generated between the panel pad terminal PE_P_1 and the output lead terminal PE_OLB, the bonding reliability between the display panel 100_1 and the COF film 300 may be deteriorated.

However, according to the present embodiment, the bonding reliability between the panel pad terminal PE_P_1 and the output lead terminal PE_OLB may be improved. For example, as described in the present embodiment, when the surface of the panel pad terminal PE_P_1 includes concave and convex portions, stress applied to the interface between the panel pad terminal PE_P_1 and the output lead terminal PE_OLB, for example, stress applied to the convex portion of the panel pad terminal PE_P_1, increases to increase a frictional force at the convex portion, and thus, the panel pad terminal PE_P_1 and the output lead terminal PE_OLB are well melted to easily perform the connection therebetween. Therefore, the bonding reliability of the COF film 300 may be improved.

Figure 14:
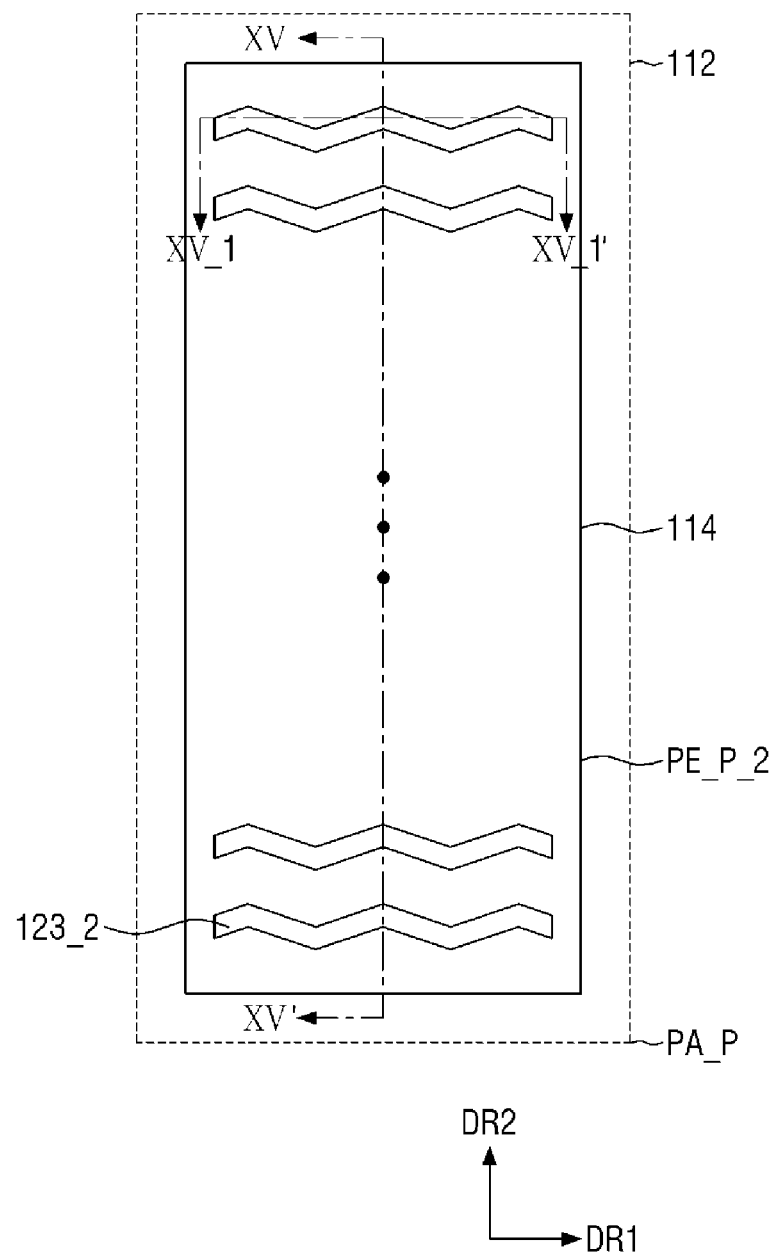
FIGS. 14-15 are a plan view and a cross-sectional view, respectively, of a panel pad terminal according to still another embodiment.
Figure 15:
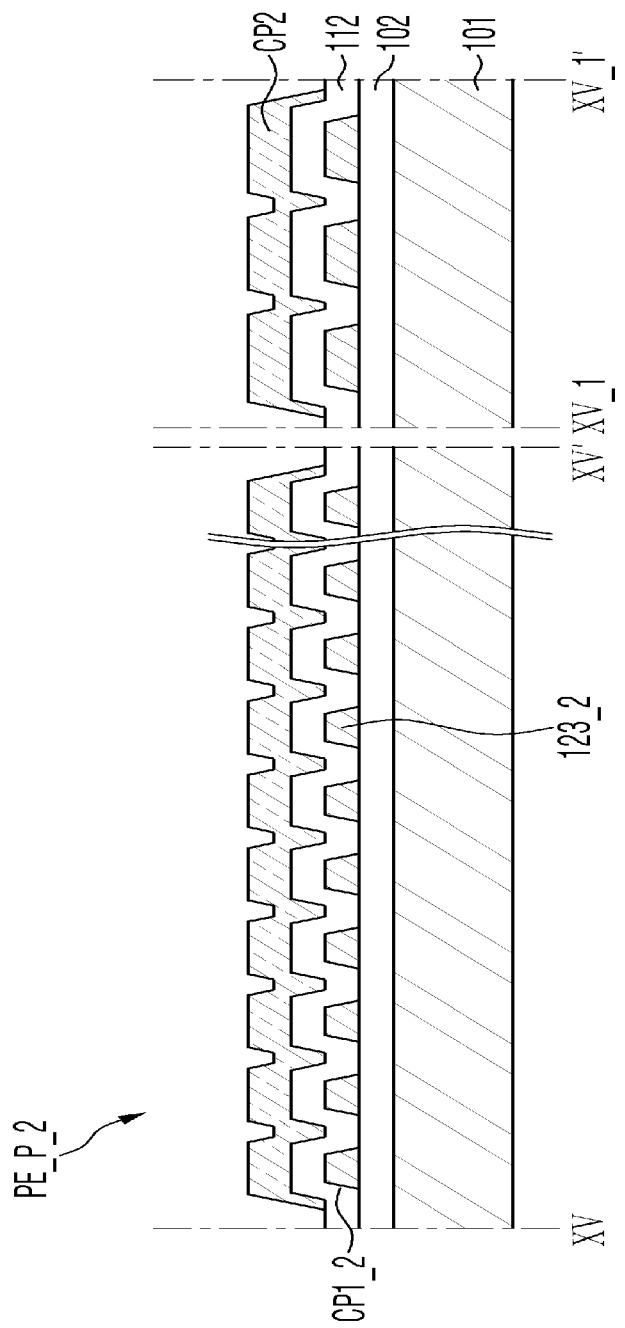

FIGS. 14-15 are a plan view and a cross-sectional view, respectively, of a panel pad terminal according to still another embodiment.

Referring to FIGS. 14-15, a panel pad terminal PE_P_2 according to still another embodiment is configured such that a first pad conductive pattern CP1_2 includes conductive electrodes 123_2 that may extend substantially in the first direction DR1 and may extend in oblique directions, for example, upper and lower diagonal directions of the first direction DR1 and the second direction DR2. When the first pad conductive pattern CP1_2 extends in such an extending direction, a shape swinging in different directions of the second direction DR2 while extending in the first direction DR1 as a whole may be formed. The swinging shape may also be referred to as a zigzag shape.

In some embodiments, the panel pad terminal PE_P_2 according to the present embodiment receives greater stress from the area protruding in the second direction DR2 and the area recessed in the second direction DR2 at the time of bonding the panel pad terminal PE_P_2 to the output lead terminal PE_OLB of the COF film 300 vibrating in the second direction DR2 by ultrasonic vibration, and thus, sufficient or suitable frictional force to reach the melting point may be generated.

Even in the present embodiment, when the output lead terminal PE_OLB of the COF film 300 is placed on the panel pad terminal PE_P_2 and ultrasonic processing is performed under a constant (e.g., substantially constant) pressure, if sufficient or suitable frictional force is not generated between the panel pad terminal PE_P_2 and the output lead terminal PE_OLB, the bonding reliability between a display panel 100_2 and the COF film 300 may be deteriorated.

However, according to the present embodiment, the bonding reliability between the panel pad terminal PE_P_2 and the output lead terminal PE_OLB may be improved. For example, as described in the present embodiment, when the surface of the panel pad terminal PE_P_2 includes concave and convex portions, stress applied to the interface between the panel pad terminal PE_P_2 and the output lead terminal PE_OLB, for example, stress applied to the convex portion of the panel pad terminal PE_P_2, increases to increase a frictional force at the convex portion, and thus, the panel pad terminal PE_P_2 and the output lead terminal PE_OLB are well melted to easily perform the connection therebetween. Therefore, the bonding reliability of the COF film 300 may be improved.

Figure 16:
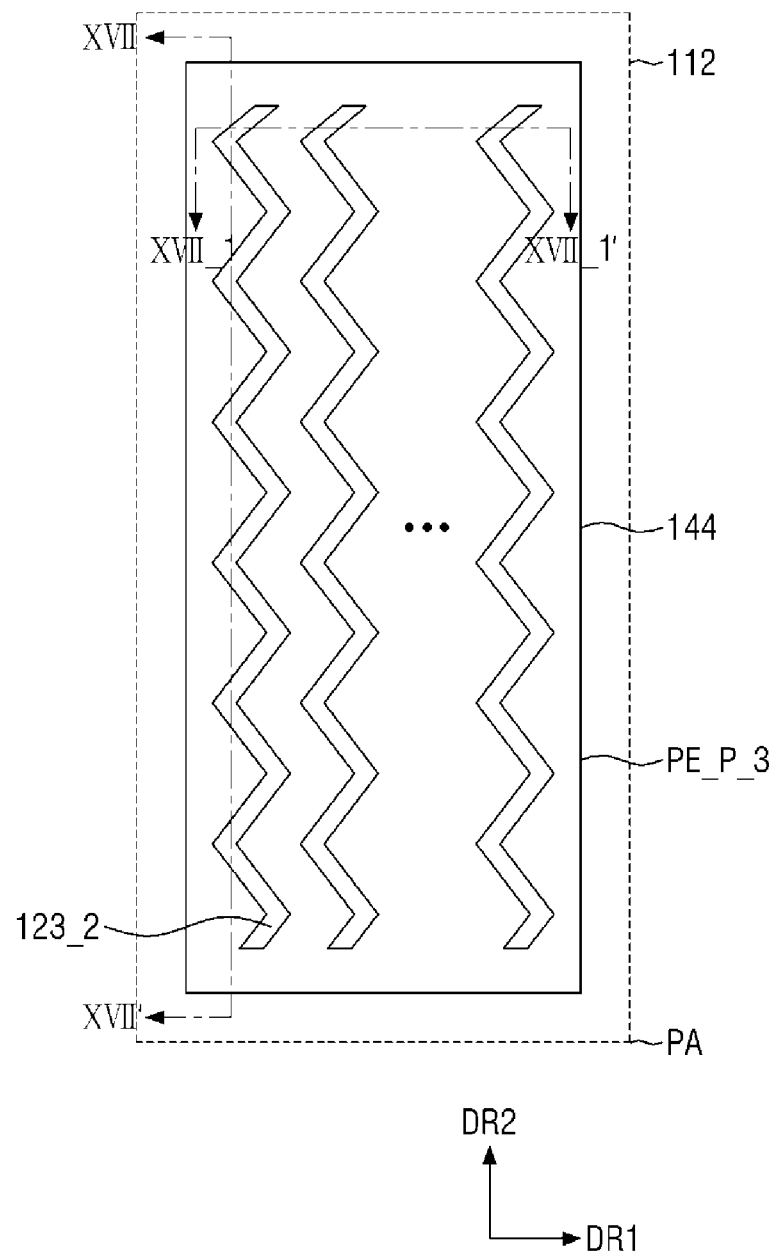
FIGS. 16-17 are a plan view and a cross-sectional view, respectively, of a panel pad terminal according to still another embodiment.
Figure 17:
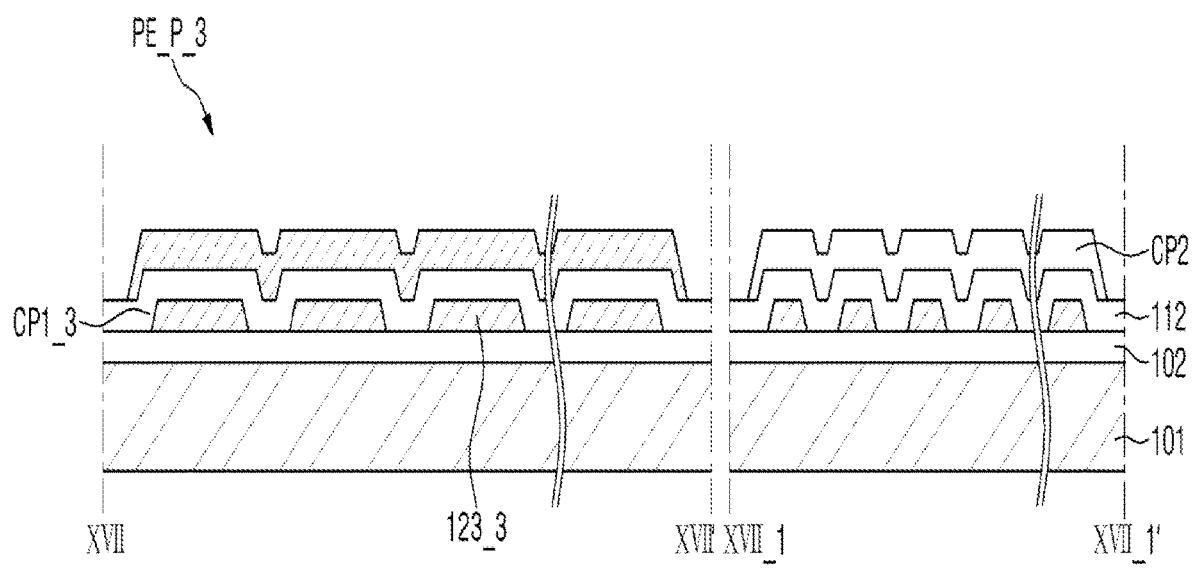

FIGS. 16-17 are a plan view and a cross-sectional view, respectively, of a panel pad terminal according to still another embodiment.

Referring to FIGS. 16-17, a panel pad terminal PE_P_3 according to the present embodiment is different from the embodiment of FIGS. 1-10 in that a first pad conductive pattern CP1_3 is configured to allow the protruding areas and recessed areas in the first direction DR1 to be repeated.

A panel pad terminal PE_P_3 according to still another embodiment is configured such that a first pad conductive pattern CP1_3 may extend substantially in the first direction DR1 and may extend in oblique directions, for example, left and right diagonal directions of the first direction DR1 and the second direction DR2. When the first pad conductive pattern CP1_3 extends in such an extending direction, a shape swinging in different directions of the first direction DR1 while extending in the second direction DR2 as a whole may be formed. The swinging shape may be referred to as a zigzag shape.

In some embodiments, the panel pad terminal PE_P_3 according to the present embodiment may be bonded to the output lead terminal PE_OLB of the COF film 300 vibrating in the second direction DR2 by ultrasonic vibration. In this case, the panel pad terminal PE_P_3 has the first pad conductive pattern CP1_3 extending in the second direction, thereby enlarging the bonding area with the output lead terminal PE_OLB. Moreover, the panel pad terminal PE_P_3 receives greater stress from the area protruding in the second direction DR2 and the area recessed in the second direction DR2, and thus, sufficient or suitable frictional force to reach the melting point may be generated.

Even in the present embodiment, when the output lead terminal PE_OLB of the COF film 300 is placed on the panel pad terminal PE_P_3 and ultrasonic processing is performed under a constant (e.g., substantially constant) pressure, if sufficient or suitable frictional force is not generated between the panel pad terminal PE_P_3 and the output lead terminal PE_OLB, the bonding reliability between a display panel 100_3 and the COF film 300 may be deteriorated.

However, according to the present embodiment, the bonding reliability between the panel pad terminal PE_P_3 and the output lead terminal PE_OLB may be improved. For example, as described in the present embodiment, when the surface of the panel pad terminal PE_P_3 includes concave and convex portions, stress applied to the interface between the panel pad terminal PE_P_3 and the output lead terminal PE_OLB, for example, stress applied to the convex portion of the panel pad terminal PE_P_3, increases to increase a frictional force at the convex portion, and thus, the panel pad terminal PE_P_3 and the output lead terminal PE_OLB are well melted to easily perform the connection therebetween. Therefore, the bonding reliability of the COF film 300 may be improved.

Figure 18A:
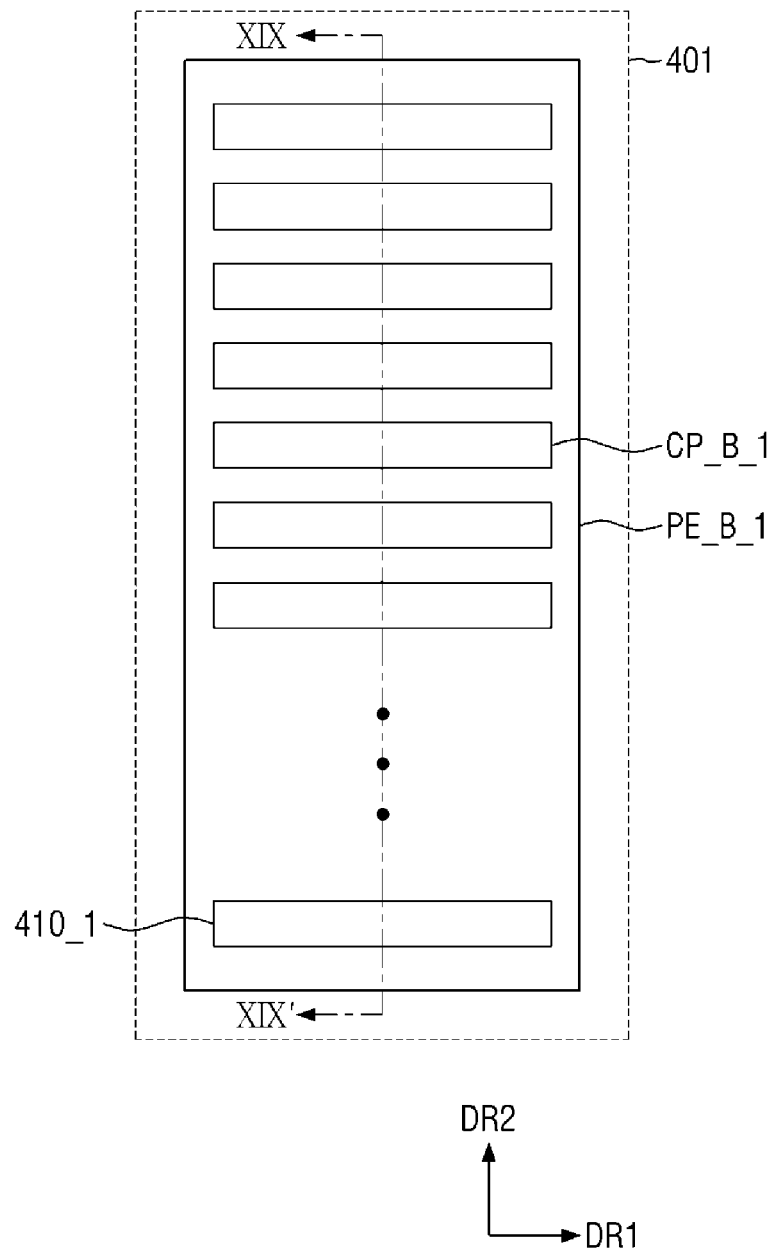
FIGS. 18A-18C are plan views.
Figure 18B:
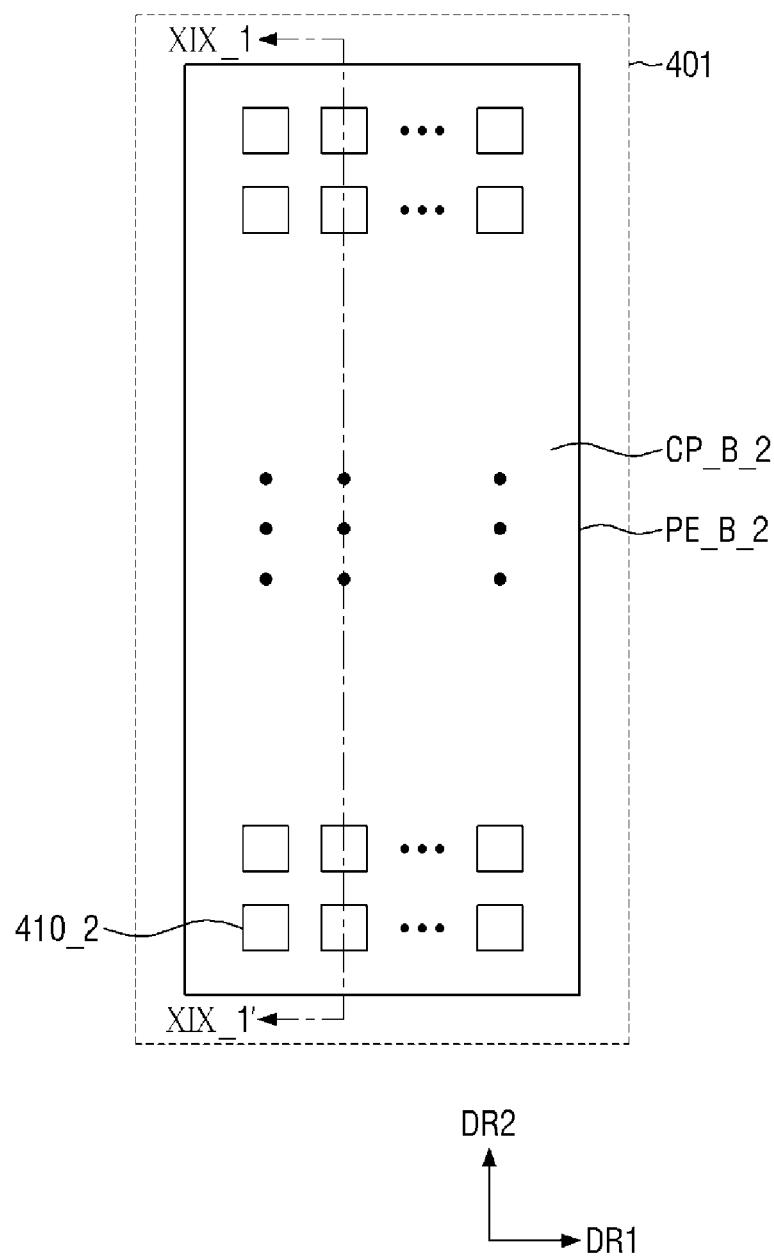
Figure 18C:
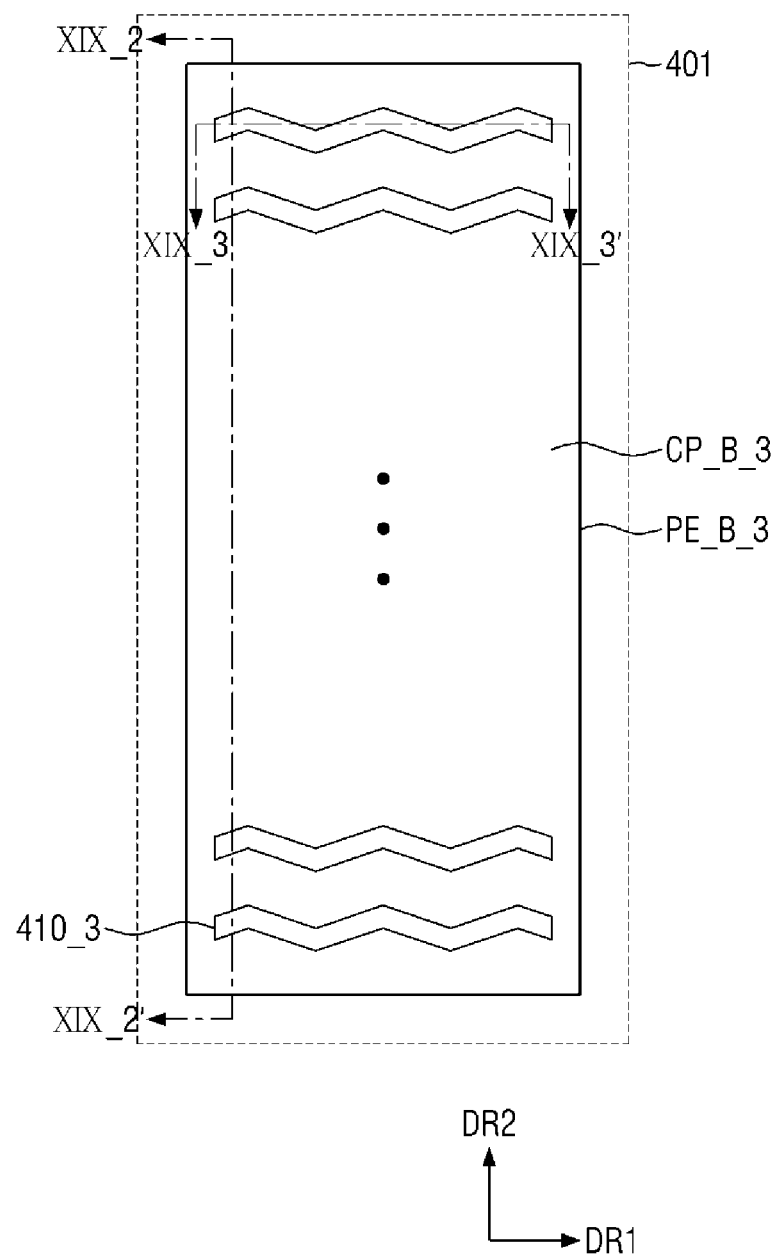
Figure 19A:
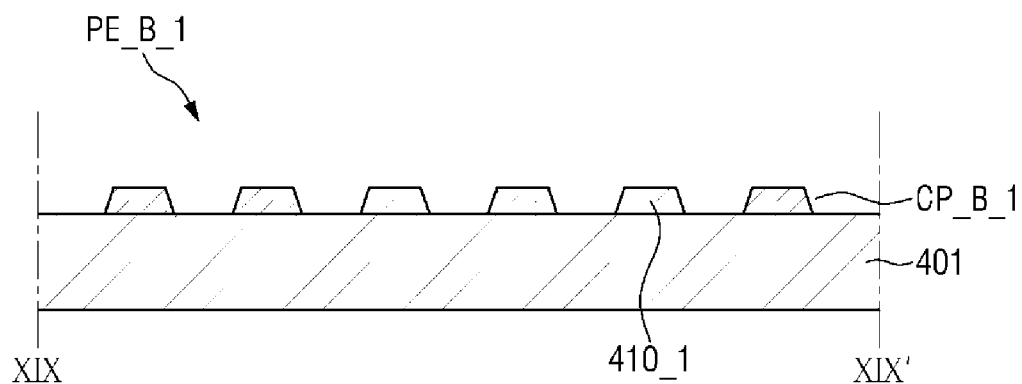
FIGS. 19A-19C are cross-sectional views, of a PCB pad terminal of a PCB substrate to which substantially the same structure as modification examples of the panel pad terminal is applied.
Figure 19B:
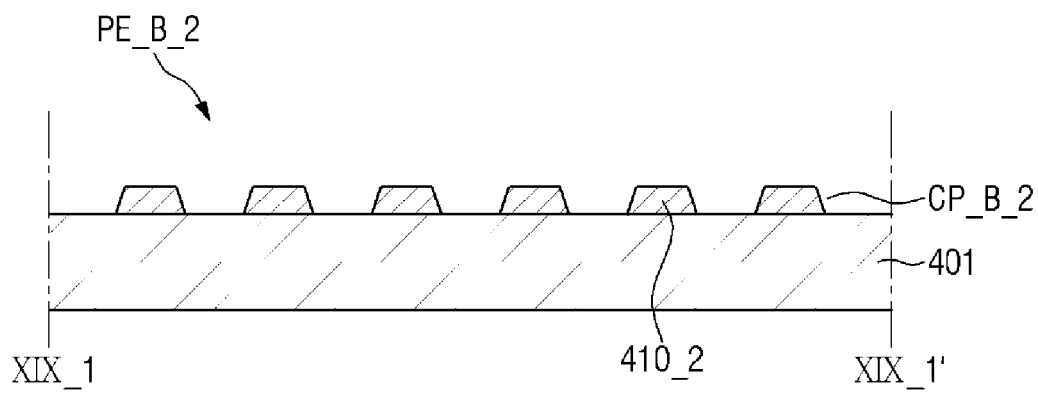
Figure 19C:
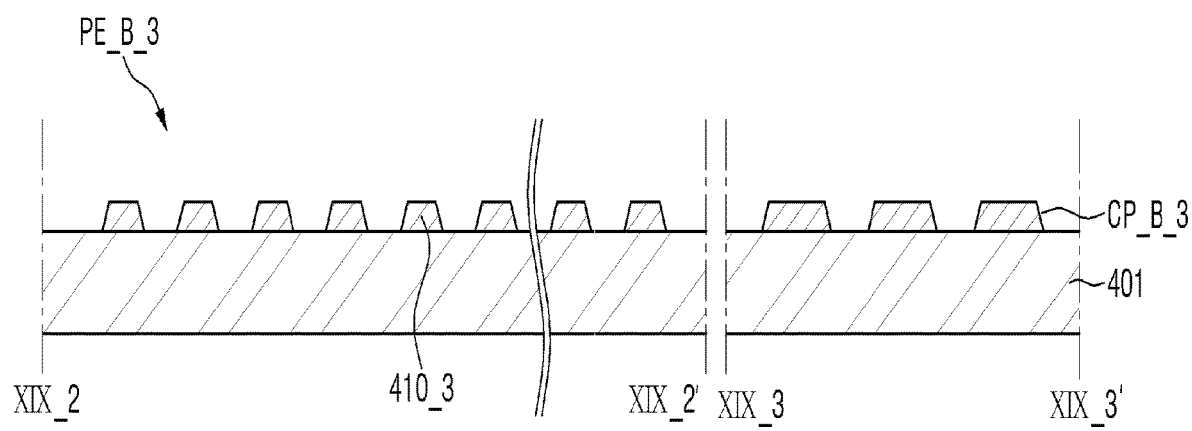

FIGS. 18A-18C are plan views, and FIGS. 19A-19C are cross-sectional views, of a PCB pad terminal of a PCB substrate to which substantially the same structure as modification examples of the panel pad terminal is applied.

Referring to FIGS. 18A-18C and 19A-19C, a PCB pad terminal PE_B according to another embodiment is different from the embodiment of FIGS. 1-10 in that the PCB pad terminal PE_B includes a concave-convex structure including various suitable modifications.

In some embodiments, when an input lead terminal PE_ILB of the COF film 300 is placed on a PCB pad terminal PE_B of a PCB substrate 400 and ultrasonic processing is performed under a constant (e.g., substantially constant) pressure, a frictional force is generated at the interface to cause partial melting, and concurrently (e.g., simultaneously), the respective components may be diffused toward each other. For example, the components included in the input lead terminal PE_ILB of the COF film 300 may be partially diffused into the PCB pad terminal PE_B, and the components included in the PCB pad terminal PE_B may be partially diffused into the input lead terminal PE_ILB of the COF film 300. As a result, the PCB pad terminal PE_B may have an area where the components included in the input lead terminal PE_ILB of the COF film 300 are diffused, and the input lead terminal PE_ILB of the COF film 300 may have an area where the components included in the PCB pad terminal PE_B are diffused.

In an area where the components of the input lead terminal PE_ILB of the PCB pad terminal PE_B are diffused and an area where the components of the PCB pad terminal PE_B of the input lead terminal PE_ILB are diffused, the input lead terminal PE_ILB and the PCB pad terminal PE_B may be directly coupled to (e.g., directly connected to) each other while being in contact with each other. The interface between the directly coupled (e.g., the directly connected) input lead terminal PE_ILB and PCB pad terminal PE_B may have a non-flat shape through melting and solidification. Further, with the mutual diffusion of the components, alloys of different materials from each other may be formed at the interface.

However, when the input lead terminal PE_ILB of the COF film 300 is placed on the PCB pad terminal PE_B and ultrasonic processing is performed under a constant (e.g., substantially constant) pressure, if sufficient or suitable frictional force is not generated between the PCB pad terminal PE_B and the input lead terminal PE_ILB, the bonding reliability between the PCB substrate 400 and the COF film 300 may be deteriorated.

However, according to the present embodiment, the bonding reliability between the PCB pad terminal PE_B and the input lead terminal PE_ILB may be improved. For example, as described in the present embodiment, when the surface of the PCB pad terminal PE_B includes concave and convex portions, stress applied to the interface between the PCB pad terminal PE_B and the input lead terminal PE_ILB, for example, stress applied to the convex portion of the PCB pad terminal PE_B, increases to increase a frictional force at the convex portion, and thus, the PCB pad terminal PE_B and the input lead terminal PE_ILB are well melted to easily perform the connection therebetween. Therefore, the bonding reliability of the COF film 300 may be improved.

Figure 20:
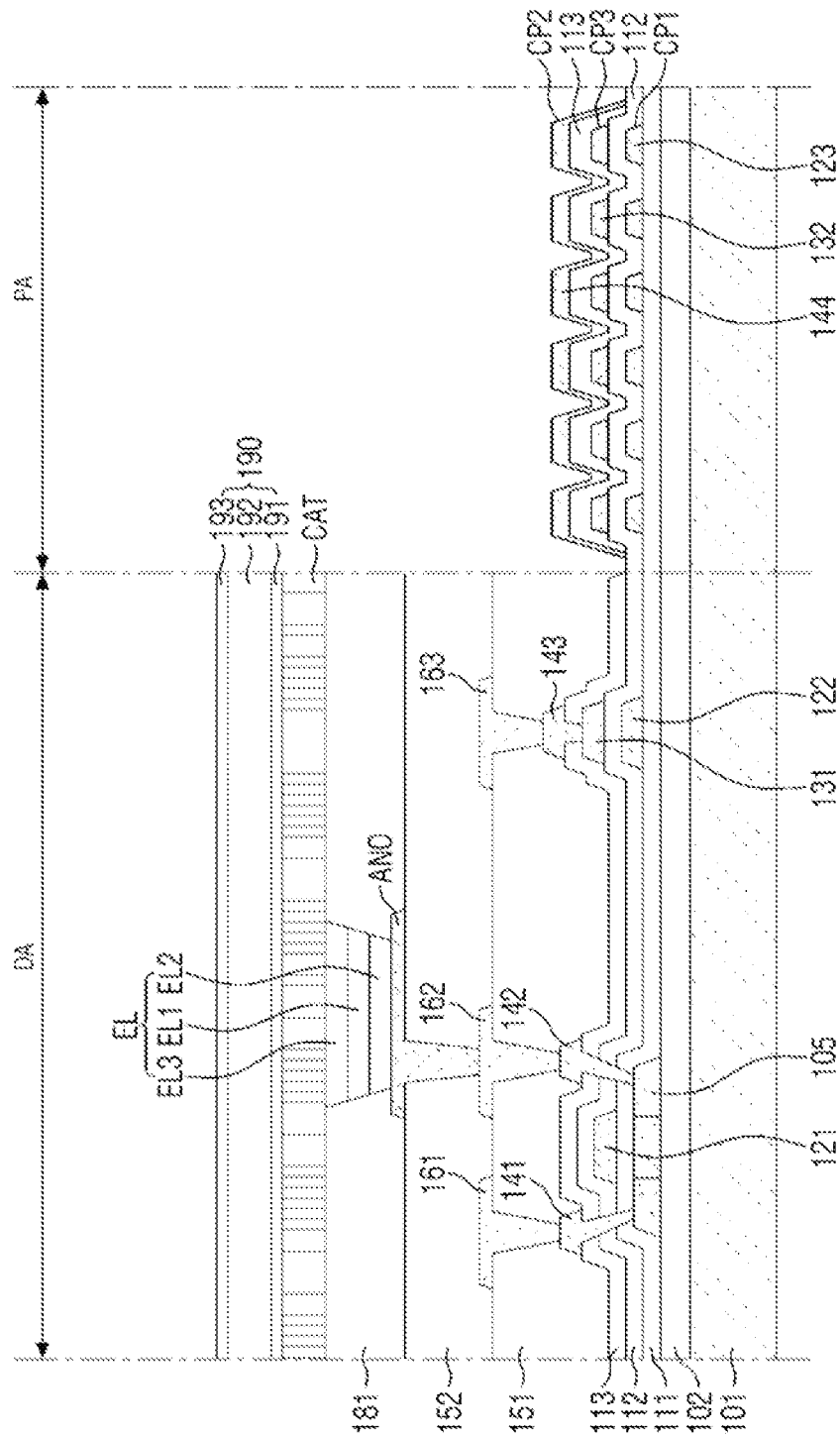
FIGS. 20-22 are cross-sectional views of a display panel according to still another embodiment.

FIG. 20 is a cross-sectional view of a display panel according to another embodiment.

Referring to FIG. 20, a display panel 100_4 according to another embodiment is different from the embodiment of FIGS. 1-10 in that the display panel 100_4 further includes a third conductive pattern CP3 on the second insulating layer 112.

In some embodiments, the display panel 100_4 according to the present embodiment may further include a third conductive pattern CP3 on the second insulating layer 112. The third pad conductive pattern CP3 may be integrally formed on the second insulating layer 112. The third pad conductive pattern CP3 may be formed of the second gate conductive layer 130. The third pad conductive pattern CP3 may include a conductive electrode 132. Although it is shown in the drawing that the conductive electrode 132 of the third pad conductive pattern CP3 is disposed to be separated in the second direction, the present disclosure is not limited thereto. Further, although it is exemplified in the present embodiment that the second insulating layer 112 is disposed between the first pad conductive pattern CP1 and the third pad conductive pattern CP3, the present disclosure is not limited thereto, and the second insulating layer 112 may be omitted.

The second pad conductive pattern CP2 may have a set (e.g., predetermined) concavo-convex shape. For example, in an area where the first pad conductive pattern CP1 and the third pad conductive pattern CP3 are disposed, the upper surface of the second pad conductive pattern CP2 has a step corresponding to the thickness of the first pad conductive electrode 123 and the third pad conductive electrode 144 as compared with an area where the first pad conductive pattern CP1 and the third pad conductive pattern CP3 are not disposed. For example, the area where the first pad conductive pattern CP1 and the third pad conductive pattern CP3 are disposed in the second pad conductive pattern CP2 is recessed by the thickness of the first pad conductive pattern CP1 and the third pad conductive pattern CP3 as compared with the area where the first pad conductive pattern CP1 and the third pad conductive pattern CP3 are not disposed, so as to form a concave portion. Therefore, the second pad conductive pattern CP2 may have a set (e.g., predetermined) concavo-convex shape due to the shapes of the first pad conductive pattern CP1 and the third pad conductive pattern CP3. Moreover, since the concave portions and convex portions of the first pad conductive pattern CP1 and the third pad conductive pattern CP3 are repeatedly arranged alternately in one direction, the second pad conductive pattern CP2 may have repetitive concave-convex structures.

Even in the present embodiment, when the output lead terminal PE_OLB of the COF film 300 is placed on a panel pad terminal PE_P_4 and ultrasonic processing is performed under a constant (e.g., substantially constant) pressure, if sufficient or suitable frictional force is not generated between the panel pad terminal PE_P_4 and the output lead terminal PE_OLB, the bonding reliability between a display panel 100_4 and the COF film 300 may be deteriorated.

However, according to the present embodiment, the bonding reliability between the panel pad terminal PE_P_4 and the output lead terminal PE_OLB may be improved. For example, as described in the present embodiment, when the surface of the panel pad terminal PE_P_4 includes concave and convex portions, stress applied to the interface between the panel pad terminal PE_P_4 and the output lead terminal PE_OLB, for example, stress applied to the convex portion of the panel pad terminal PE_P_4, increases to increase the frictional force at the convex portion, and thus, the panel pad terminal PE_P_4 and the output lead terminal PE_OLB are well melted to easily perform the connection therebetween. Therefore, the bonding reliability of the COF film 300 may be improved.

Figure 21:
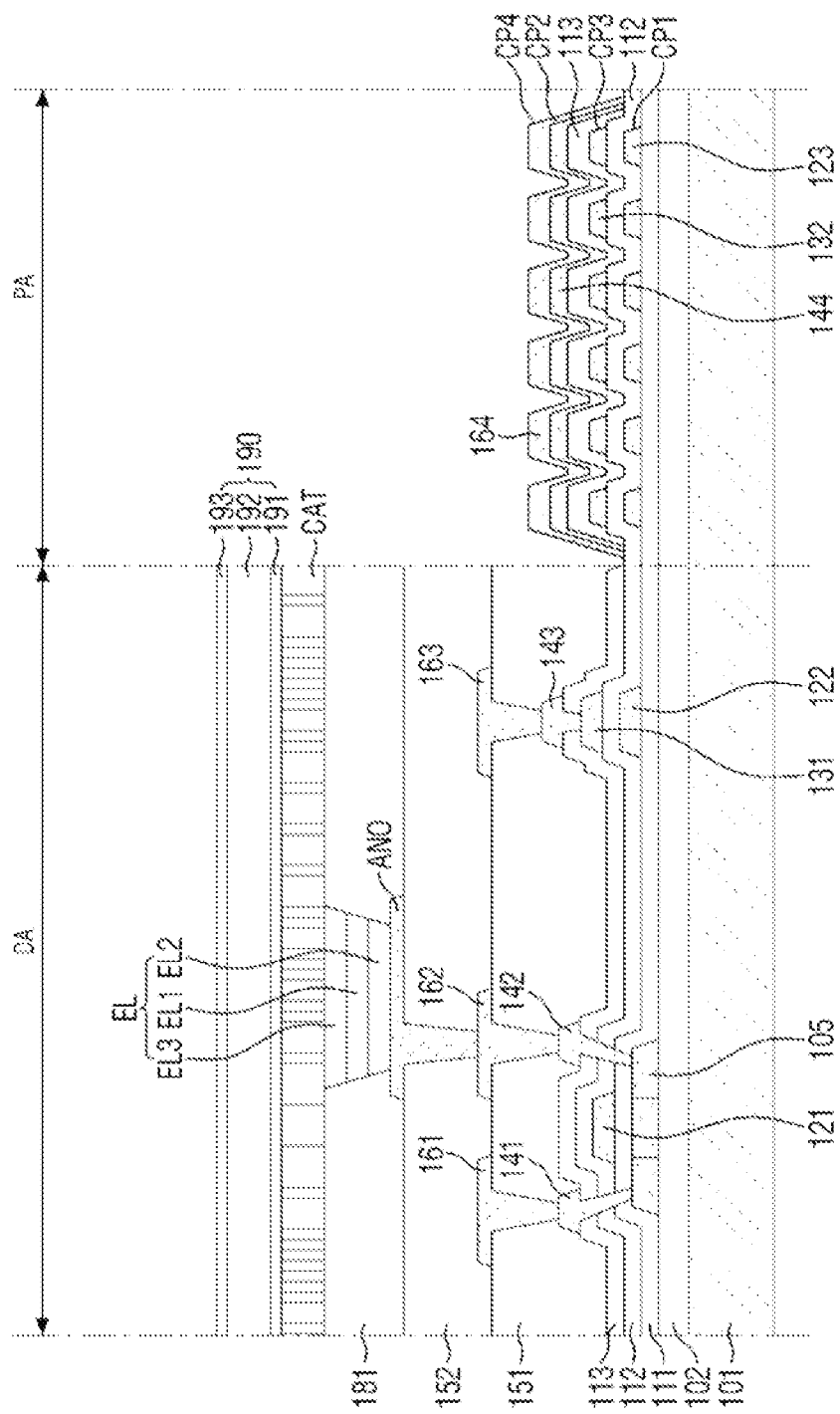

FIG. 21 is a cross-sectional view of a display panel according to still another embodiment.

Referring to FIG. 21, a display panel 100_5 according to still another embodiment is different from the embodiment of FIG. 20 in that the display panel 100_5 further includes a fourth pad conductive pattern CP4 on the second pad conductive pattern CP2.

In some embodiments, the fourth pad conductive pattern CP4 may be integrally formed on the second pad conductive pattern CP2. Further, the fourth pad conductive pattern CP4 may be formed of the second source/drain conductive layer 140.

The fourth pad conductive pattern CP4 may have a set (e.g., predetermined) concavo-convex shape. For example, in an area where the first pad conductive pattern CP1 and the third pad conductive pattern CP3 are disposed, the upper surface of the fourth pad conductive pattern CP4 has a step corresponding to the thickness of the first pad conductive electrode 123 and the third pad conductive electrode 144 as compared with an area where the first pad conductive pattern CP1 and the third pad conductive pattern CP3 are not disposed. In some embodiments, the area where the first pad conductive pattern CP1 and the third pad conductive pattern CP3 are disposed in the fourth pad conductive pattern CP4 protrudes by the thickness of the first pad conductive pattern CP1 and the third pad conductive pattern CP3 as compared with the area where the first pad conductive pattern CP1 and the third pad conductive pattern CP3 are not disposed, so as to form a convex portion. Further, the area where the first pad conductive pattern CP1 and the third pad conductive pattern CP3 are not disposed is recessed by the thickness of the first pad conductive pattern CP1 and the third pad conductive pattern CP3 as compared with the convex portion, so as to form a concave portion. Therefore, the fourth pad conductive pattern CP4 may have a set (e.g., predetermined) concavo-convex shape due to the shapes of the first pad conductive pattern CP1 and the third pad conductive pattern CP3. Moreover, since the concave portions and convex portions of the first pad conductive pattern CP1 and the third pad conductive pattern CP3 are repeatedly arranged alternately in one direction, the fourth pad conductive pattern CP4 may have repetitive concave-convex structures.

Even in the present embodiment, when the output lead terminal PE_OLB of the COF film 300 is placed on a panel pad terminal PE_P_5 and ultrasonic processing is performed under a constant (e.g., substantially constant) pressure, if sufficient or suitable frictional force is not generated between the panel pad terminal PE_P_5 and the output lead terminal PE_OLB, the bonding reliability between a display panel 100_5 and the COF film 300 may be deteriorated.

However, according to the present embodiment, the bonding reliability between the panel pad terminal PE_P_5 and the output lead terminal PE_OLB may be improved. For example, as described in the present embodiment, when the surface of the panel pad terminal PE_P_5 includes concave and convex portions, stress applied to the interface between the panel pad terminal PE_P_5 and the output lead terminal PE_OLB, for example, stress applied to the convex portion of the panel pad terminal PE_P_5, increases to increase a frictional force at the convex portion, and thus, the panel pad terminal PE_P_5 and the output lead terminal PE_OLB are well melted to easily perform the connection therebetween. Therefore, the bonding reliability of the COF film 300 may be improved.

Figure 22:
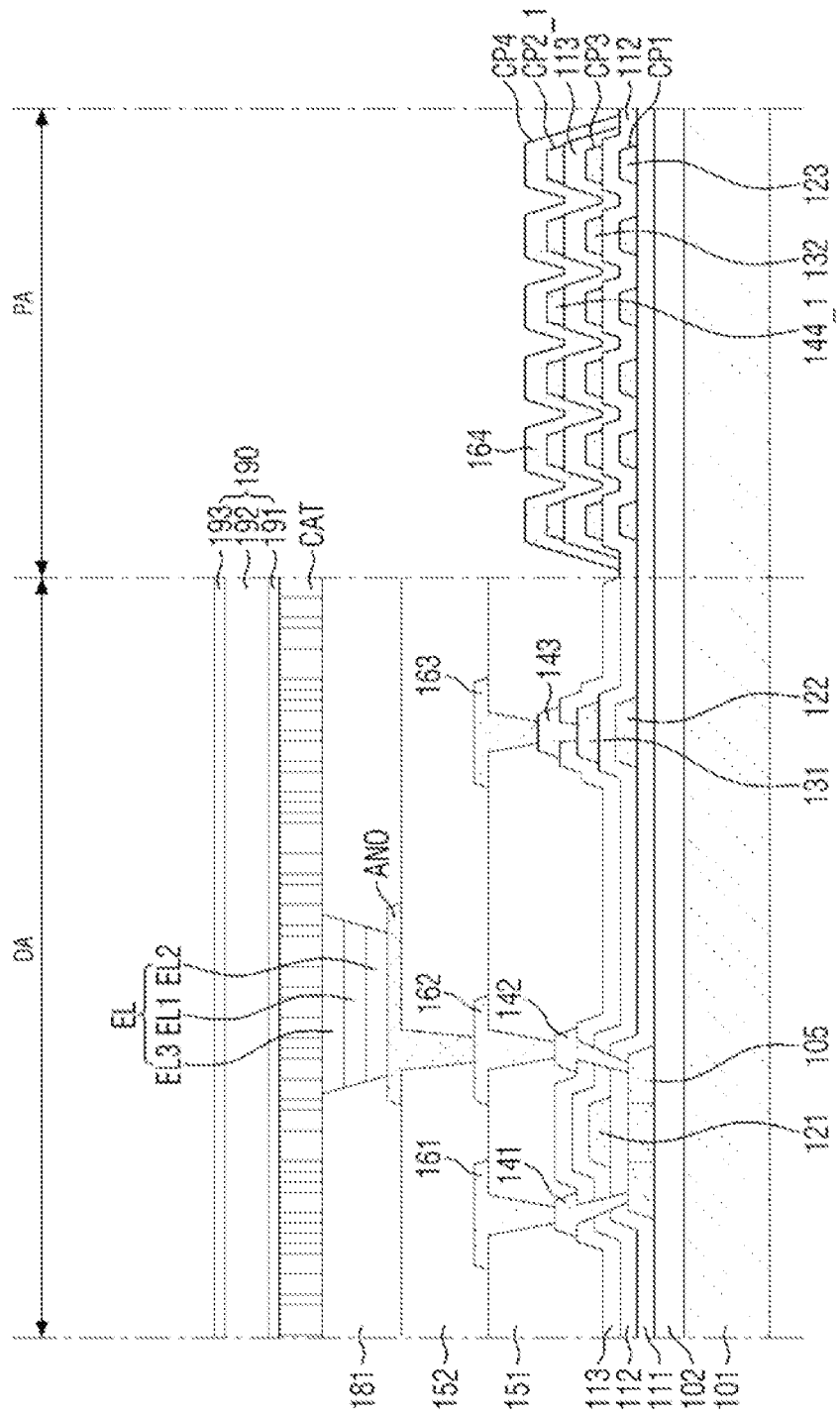

FIG. 22 is a cross-sectional view of a display panel according to still another embodiment.

Referring to FIG. 22, a display panel 100_6 according to still another embodiment is different from the embodiment of FIG. 21 in that the second pad conductive pattern CP2 includes a plurality of conductive electrodes 144_1 spaced apart from each other in the second direction.

In some embodiments, in the display panel 100_6 according to the present embodiment, the second pad conductive pattern CP2 may include a plurality of conductive electrodes 144_1 spaced apart from each other in the second direction.

Even in the present embodiment, the fourth pad conductive pattern CP4 may have a set (e.g., predetermined) concavo-convex shape. For example, in an area where the first pad conductive pattern CP1 to the third pad conductive pattern CP3 are disposed, the upper surface of the fourth pad conductive pattern CP4 has a step corresponding to the thickness of the first pad conductive electrode 123 to the third pad conductive electrode 144 as compared with an area where the first pad conductive pattern CP1 to the third pad conductive pattern CP3 are not disposed. For example, the area where the first pad conductive pattern CP1 to the third pad conductive pattern CP3 are disposed in the fourth pad conductive pattern CP4 protrudes by the thickness of the first pad conductive pattern CP1 to the third pad conductive pattern CP3 as compared with the area where the first pad conductive pattern CP1 to the third pad conductive pattern CP3 are not disposed, so as to form a convex portion. Further, the area where the first pad conductive pattern CP1 to the third pad conductive pattern CP3 are not disposed is recessed by the thickness of the first pad conductive pattern CP1 and the third pad conductive pattern CP3 as compared with the convex portion, so as to form a concave portion. Therefore, the fourth pad conductive pattern CP4 may have a set (e.g., predetermined) concavo-convex shape due to the shapes of the first pad conductive pattern CP1 to the third pad conductive pattern CP3. Moreover, since the concave portions and convex portions of the first pad conductive pattern CP1 to the third pad conductive pattern CP3 are repeatedly arranged alternately in one direction, the second pad conductive pattern CP4 may have repetitive concave-convex structures.

Even in the present embodiment, when the output lead terminal PE_OLB of the COF film 300 is placed on a panel pad terminal PE_P_4 and ultrasonic processing is performed under a constant (e.g., substantially constant) pressure, if sufficient or suitable frictional force is not generated between the panel pad terminal PE_P_4 and the output lead terminal PE_OLB, the bonding reliability between a display panel 100_4 and the COF film 300 may be deteriorated.

However, according to the present embodiment, the bonding reliability between the panel pad terminal PE_P_4 and the output lead terminal PE_OLB may be improved. For example, as described in the present embodiment, when the surface of the panel pad terminal PE_P_4 includes concave and convex portions, stress applied to the interface between the panel pad terminal PE_P_4 and the output lead terminal PE_OLB, for example, stress applied to the convex portion of the panel pad terminal PE_P_4, increases to increase a frictional force at the convex portion, and thus, the panel pad terminal PE_P_4 and the output lead terminal PE_OLB are well melted to easily perform the connection therebetween. Therefore, the bonding reliability of the COF film 300 may be improved.

As described above, according to embodiments of the present disclosure, it is possible to provide a display device having high bonding reliability.

The effects of the present disclosure are not limited by the foregoing, and other various suitable effects are encompassed within the scope of the present disclosure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the certain embodiments of the present disclosure have been disclosed for illustrative purposes, those skilled in the art will appreciate that various suitable modifications, additions and substitutions are possible, without departing from the scope and spirit of the present disclosure as set forth in the appended claims, and equivalents thereof.

What is claimed is:
1. A display device comprising:
   a display area;
   a non-display area around the display area;
   a substrate; and
   a first pad in the non-display area on the substrate,
   wherein the first pad comprises:
      a plurality of first conductive patterns spaced apart from each other and arranged along a first direction,
      a second conductive pattern on the plurality of first conductive patterns, covering the plurality of first conductive patterns, the second conductive pattern comprising a plurality of concave portions and a plurality of convex portions on a surface thereof,
      an insulating layer disposed between the plurality of first conductive patterns and the second conductive pattern, and
      each of the plurality of concave portions of the surface of the second conductive pattern overlaps an area where each of the first conductive patterns is not disposed.

2. The display device of claim 1, wherein at least one of the plurality of first conductive patterns electrically contacts with the second conductive pattern.

3. The display device of claim 1, wherein each of the plurality of first conductive patterns extends in a second direction crossing the first direction.

4. The display device of claim 3, wherein a width of each of the first conductive patterns in the second direction is greater than a width of each of the first conductive pattern in the first direction.

5. The display device of claim 4, wherein a width of the second conductive pattern in the first direction is greater than a width of the second conductive pattern in the second direction.

6. The display device of claim 3, wherein a width of the second conductive pattern in the second direction is greater than a width of the first conductive pattern in the second direction.

7. The display device of claim 6, wherein a width of the second conductive pattern in the first direction is greater than a width of the first conductive pattern in the first direction.

8. The display device of claim 1, wherein the plurality of the first conductive patterns are spaced apart from each other with a same interval.

9. A display device comprising:
a display area;
a non-display area around the display area;
a substrate; and
a first pad in the non-display area on the substrate,
wherein the first pad comprises:
a plurality of first conductive patterns,
an insulating layer on the plurality of first conductive patterns, and
a second conductive pattern on the insulating layer,
wherein a portion of the insulating layer is between adjacent ones of the plurality of first conductive patterns,
wherein the second conductive pattern comprises a plurality of concave portions and a plurality of convex portions on a surface thereof,
wherein the second conductive pattern covers an entire area of the plurality of first conductive patterns, and
wherein at least one of the plurality of first conductive patterns electrically contacts with the second conductive pattern.

10. The display device of claim 9, wherein each of the plurality of first conductive patterns has a first rectangular shape and the second conductive pattern has a second rectangular shape in a plan view, and
wherein the first rectangular shape has a short edge extending in a first direction and a long edge extending in a second direction which is perpendicular to the first direction, and the second rectangular shape has a short edge extending in the second direction and a long edge extending in the first direction.

11. The display device of claim 10, wherein a width of the short edge of the second rectangular shape is greater than a width of the long edge of the first rectangular shape.

12. A display device comprising:
a display area;
a non-display area around the display area;
a substrate; and
a first pad in the non-display area on the substrate,
wherein the first pad comprises:
a plurality of first conductive patterns,
an insulating layer on the plurality of first conductive patterns, and
a second conductive pattern on the insulating layer,
wherein the second conductive pattern covers an entire area of the plurality of first conductive patterns,
wherein at least one of the plurality of first conductive patterns electrically contacts with the second conductive pattern,
wherein the second conductive pattern comprises a plurality of concave portions and a plurality of convex portions on a surface thereof, and
wherein each of the plurality of concave portions of the surface of the second conductive pattern overlaps an area where each of the first conductive patterns is not disposed.

* * * * *